United States Patent
Tan et al.

[11] Patent Number: 6,004,721
[45] Date of Patent: Dec. 21, 1999

[54] POSITIVE PHOTORESIST COMPOSITION

[75] Inventors: Shiro Tan; Toshiaki Aoai; Toru Fujimori, all of Shizuoka, Japan

[73] Assignee: Fuji Photo Film Co., Ltd., Kanagawa, Japan

[21] Appl. No.: 09/018,883

[22] Filed: Feb. 5, 1998

[30] Foreign Application Priority Data

Feb. 7, 1997 [JP] Japan ................................ 9-025369

[51] Int. Cl.$^6$ .................................................. G03F 7/004
[52] U.S. Cl. ........................ 430/270.1; 430/905; 522/31
[58] Field of Search ............................... 430/270.1, 905; 522/31

[56] References Cited

U.S. PATENT DOCUMENTS 5,852,128  12/1998  Padmanaban et al. ............. 430/270.1
5,876,900   3/1999  Watanabe et al. ................. 430/270.1

*Primary Examiner*—John S. Chu
*Attorney, Agent, or Firm*—Sughrue, Mion, Zinn, Macpeak & Seas, PLLC

[57] ABSTRACT

A positive photoresist composition is disclosed which comprises (a) a resin obtained from an alkali-soluble resin containing phenolic hydroxyl groups by replacing from 10 to 80% of the phenolic hydroxyl groups each with a group having a specific structure, (b) a compound which generates an acid upon irradiation with actinic rays or a radiation, and (c) a solvent. This composition is an excellent, chemically amplified photoresist composition which has high resolution and gives a resist pattern having no depressions in an upper part thereof and having satisfactory adhesion to the substrate.

4 Claims, No Drawings

POSITIVE PHOTORESIST COMPOSITION

FIELD OF THE INVENTION

The present invention relates to a positive photoresist composition for use in the production of semiconductor IC elements, masks for IC production, printed circuit boards, liquid-crystal panels, etc.

BACKGROUND OF THE INVENTION

Conventional resists comprising a novolak and a naphthoquinonediazide compound are unsuitable for use in pattern formation by lithography using far ultraviolet rays or excimer laser beams, because the novolak and the naphthoquinonediazide show intense absorption in the far ultraviolet region to render the light less apt to reach the resist bottom. Thus, the resist has low sensitivity to give only a tapered pattern.

One means for eliminating the above problem is the chemically amplified resist composition described in, e.g., U.S. Pat. No. 4,491,628 and European Patent 29,139. A chemically amplified positive resist composition is a pattern-forming material in which an acid generates in exposed areas upon irradiation with a radiation such as far ultraviolet rays and this acid catalyzes a reaction that makes the areas irradiated with the actinic rays and the unirradiated areas to differ in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations show high photosensitivity since they have a quantum efficiency exceeding 1 as the principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; Polym. Eng. Sce., Vol. 23, p. 12 (1983); ACS. Sym., Vol. 242, p. 11 (1984); Semiconductor World, November 1987 issue, p. 91; Macromolecules, Vol. 21, p. 1475 (1988); and SPIE, Vol. 920, p. 42 (1988). Since these systems also have high sensitivity and show reduced absorption in the deep UV region as compared with the naphthoquinonediazide/novolak resin systems, they can be effective systems for coping with the utilization of the light source having shorter wavelength.

The chemically amplified positive resist compositions described above are roughly divided into three groups: three-component systems comprising an alkali-soluble resin, a compound which generates an acid upon exposure to a radiation (photo-acid generator), and a dissolution inhibitive compound for the alkali-soluble resin which has acid-decomposable groups; two-component systems comprising a resin having groups which decompose upon reaction with an acid to render the resin alkali-soluble and a photo-acid generator; and hybrid systems comprising a resin having groups which decompose upon reaction with an acid to render the resin alkali-soluble, a low-molecular dissolution inhibitive compound having an acid-decomposable group, and a photo-acid generator.

In JP-A-2-19847 is disclosed a resist composition characterized by containing a resin obtained from poly(p-hydroxystyrene) by protecting all or part of the phenolic hydroxyl groups each with a tetrahydropyranyl group.

In JP-A-4-219757 is disclosed a resist composition characterized by containing a resin obtained likewise from poly(p-hydroxystyrene) by replacing from 20 to 70% of the phenolic hydroxyl groups each with an acetal group.

Moreover, JP-A-5-249682 discloses a photoresist composition containing a similar resin protected with an acetal. In JP-A-8-123032 is disclosed a photoresist composition containing a terpolymer having groups substituted with acetal groups.

Furthermore, JP-A-8-253534 discloses a photoresist composition containing a partly crosslinked polymer having groups substituted with acetal groups.

However, these prior art compositions have a problem that they are unsuitable for use in producing IC elements on the order of sub-half-micron since resist patterns formed therefrom have depressions in an upper part thereof. Those compositions have another problem that the resist patterns have poor adhesion to substrates and this arouses troubles such as fine-pattern collapse.

As described above, the prior art photoresist compositions have problems that they are unsuitable for use in producing IC elements on the order of sub-half-micron since resist patterns formed therefrom have depressions in an upper part thereof, and that the pattern/substrate adhesion is poor to arouse troubles such as fine-pattern collapse. Hence, further improvements have been desired.

SUMMARY OF THE INVENTION

An object of the present invention is to provide an excellent, chemically amplified positive photoresist composition which has high resolution and gives a resist pattern having no depressions in an upper part thereof and having satisfactory adhesion to the substrate.

As a result of intensive investigations made by the present inventor under these circumstances, it has been found that a positive photoresist composition comprising an alkali-soluble resin binder substituted with substituents having a specific structure, a compound which generates an acid upon irradiation with actinic rays or a radiation, and a solvent has high resolution and is effective in eliminating the above-described problems such as the occurrence of depressions and the poor adhesion to substrates. The present invention has been completed based on this finding.

The present invention provides a positive photoresist composition which has any of the following constitutions.

(1) A positive photoresist composition which comprises (a) a resin obtained by replacing from 10 to 80% of the phenolic hydroxyl groups contained in an alkali-soluble resin containing phenolic hydroxyl groups with a group represented by the following general formula (I), (b) a compound which generates an acid upon irradiation with actinic rays or a radiation, and (c) a solvent,

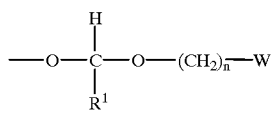

wherein
- $R^1$ represents a substituent selected from alkyl groups having 1 to 4 carbon atoms,
- W is an organic residue containing at least one atom selected from oxygen, nitrogen, sulfur, phosphorus, and silicon atoms or an atomic group selected from the group consisting of an amino group, an ammonium group, and a mercapto group, and
- n represents a natural number of from 1 to 4.

(2) The positive photoresist composition as described in (1) above, wherein W in general formula (I) for component (a) is a group selected from the group consisting of the following substituents:

W:

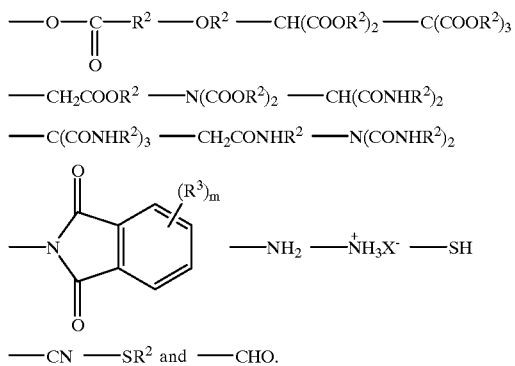

wherein
- $R^2$ represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group,
- $R^3$ represents a hydrogen atom, a linear, branched, or cyclic alkyl group having 1 to 6 carbon atoms, a linear, branched, or cyclic alkoxy group having 1 to 6 carbon atoms, or a substituent selected from the group consisting of a halogen atom, a nitro group, an amino group, a hydroxyl group, and a cyano group,
- X represents a halogen atom, and
- m represents a natural number of from 1 to 4.

(3) The positive photoresist composition as described in (1) above, wherein the group represented by general formula (I) is the group represented by general formula (II).

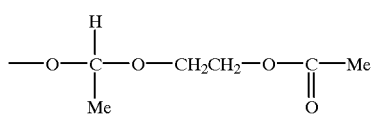

(4) The positive photoresist composition as described in any one of (1) to (3) above, wherein the alkali-soluble resin containing phenolic hydroxyl groups is poly(p-hydroxystyrene).

DETAILED DESCRIPTION OF THE INVENTION

The alkali-soluble resin containing phenolic hydroxyl groups used for the present invention is preferably a copolymer of o-, m-, or p-hydroxystyrene or o-, m-, or p-hydroxy-α-methylstyrene in which the content of the styrene derivative is at least 30 mol %, preferably at least 50 mol %, a homopolymer of any of these styrene derivatives, or a partially hydrogenated resin derived from the copolymer or homopolymer. More preferred is a homopolymer of p-hydroxystyrene. Preferred examples of comonomers usable for the above copolymer include acrylic esters, methacrylic esters, acrylamide and analogues thereof, methacrylamide and analogues thereof, acrylonitrile, methacrylonitrile, maleic anhydride, styrene, α-methylstyrene, acetoxystyrene, and alkoxystyrenes. More preferred are styrene, acetoxystyrene, and t-butoxystyrene.

This alkali-soluble resin has a weight-average molecular weight of from 3,000 to 80,000, preferably from 7,000 to 50,000, and a molecular weight distribution ($M_w/M_n$) in the range of from 1.01 to 4.0, preferably from 1.05 to 1.20. A polymerization technique such as anionic polymerization is preferably used for obtaining a polymer having a molecular weight distribution in the above range.

In the present invention, it is essential to use a resin obtained from the above-described alkali-soluble resin containing phenolic hydroxyl groups by replacing from 10 to 80% of the hydroxyl groups each with a group represented by general formula (I) given above.

In general formula (I),
- $R^1$ represents a substituent selected from alkyl groups having 1 to 4 carbon atoms,
- W is an organic residue containing at least one atom selected from oxygen, nitrogen, sulfur, phosphorus, and silicon atoms or an atomic group selected from the group consisting of an amino group, an ammonium group, and a mercapto group, and
- n represents a natural number of from 1 to 4.

Preferred examples of $R^1$ include methyl, ethyl, n-propyl, isopropyl, n-butyl, isobutyl, sec-butyl, and t-butyl. More preferred is methyl.

The organic residue represented by W is constituted of at least one atom selected from oxygen, nitrogen, sulfur, phosphorus, and silicon atoms and at least one carbon atom.

Preferred examples of W include the following groups.

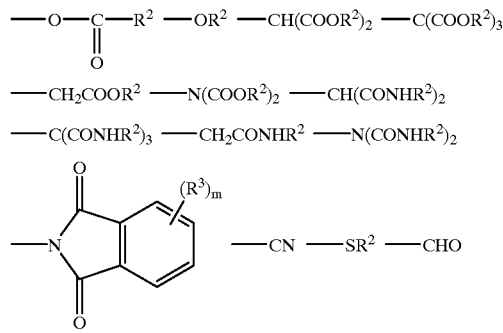

In the above formulae,
- $R^2$ represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group, R³ represents a hydrogen atom, a linear, branched, or cyclic alkyl group having 1 to 6 carbon atoms, a linear, branched, or cyclic alkoxy group having 1 to 6 carbon atoms, or a substituent selected from the group consisting of a halogen atom, a nitro group, an amino group, a hydroxyl group, and a cyano group, X represents a halogen atom, and n represents a natural number of from 1 to 4, preferably 2 or 3, and m represents a natural number of from 1 to 4, preferably 1 or 2.

Preferred examples of the linear, branched, or cyclic alkyl group having 1 to 6 carbon atoms as the group represented by R² or R³ include methyl, ethyl, n-propyl, isopropyl, cyclopropyl, n-butyl, isobutyl, sec-butyl, t-butyl, pentyl, isopentyl, neopentyl, cyclopentyl, hexyl, and cyclohexyl. More preferred are methyl and ethyl.

Preferred examples of the linear, branched, or cyclic alkenyl group having 2 to 6 carbon atoms as the group represented by R² include vinyl, 1-propenyl, allyl, isopropenyl, 1-butenyl, 2-butenyl, 2-pentenyl, and cyclohexenyl. More preferred are vinyl and isopropenyl.

Preferred examples of the aryl group include phenyl, tolyl, xylyl, mesityl, and cumenyl, with phenyl being more preferred. Preferred examples of the aralkyl group include benzyl, phenethyl, α-methylbenzyl, and benzhydryl, with benzyl being more preferred. These aryl and aralkyl groups may have one or more substituents selected from halogen atoms, nitro, alkoxy, acetyl, amino, ester, and amido groups, and the like.

Preferred examples of the linear, branched, or cyclic alkoxy group having 1 to 6 carbon atoms as the group represented by R³ include methoxy, ethoxy, propoxy, isopropoxy, butoxy, pentyloxy, and hexyloxy. More preferred are methoxy and ethoxy.

Preferred examples of the halogen atom include fluorine, chlorine, bromine, and iodine. More preferred are chlorine and bromine.

As shown above, W may be a cyano or formyl group.

Specific examples of general formula (I) are given below. However, general formula (I) should not be construed as being limited to these examples, in which Me, Et, and Ph represent methyl, ethyl, and phenyl, respectively.

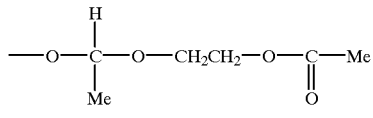

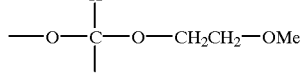

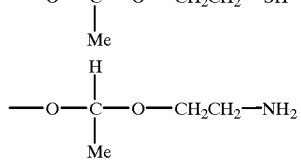

-continued

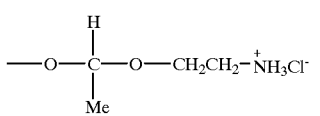

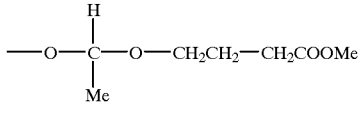

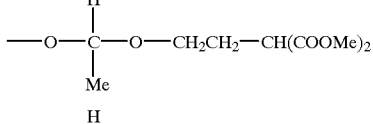

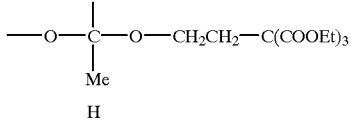

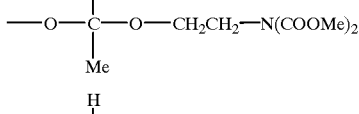

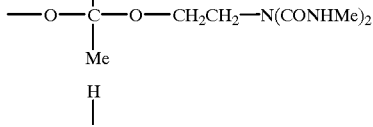

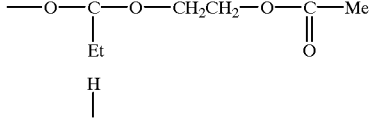

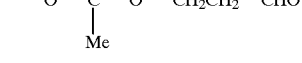

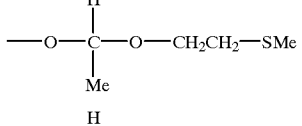

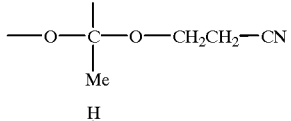

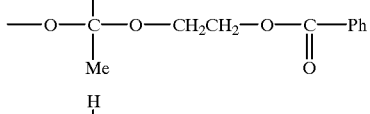

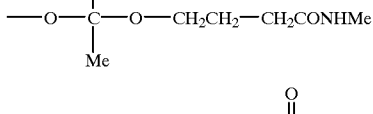

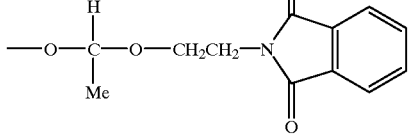

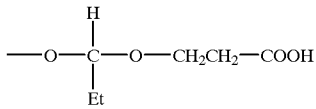

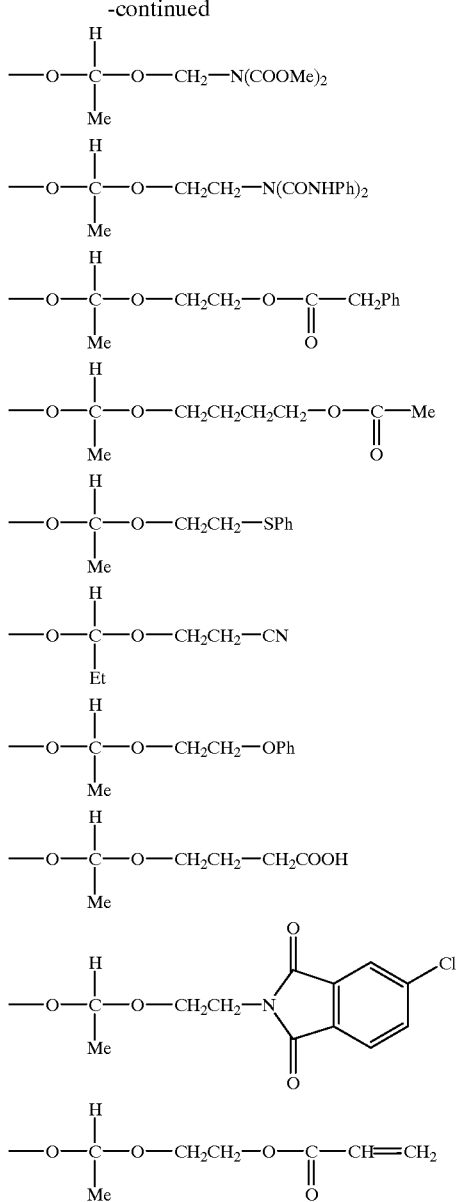

A resin having the substituents described above can be obtained by synthesizing a vinyl ether corresponding to the substituent and reacting the ether by a known method with the alkali-soluble resin containing phenolic hydroxyl groups which has been dissolved in an appropriate solvent, e.g., tetrahydrofuran. The desired degree of the replacement by the substituent can be achieved by controlling the charged amount of the ether. This reaction is usually conducted in the presence of an acid catalyst, preferably an acid ion-exchange resin, hydrochloric acid, p-toluenesulfonic acid, or a salt such as pyridinium tosylate. The corresponding vinyl ether can be synthesized from an active starting material such as chloroethyl vinyl ether through a nucleophilic substitution reaction or by another method.

Specific examples of the structure of the polymer are given below. However, the resin used in the present invention should not be construed as being limited to these examples, in which Me represents methyl, Et ethyl, Ph phenyl, tBu t-butyl, and Ac acetyl.

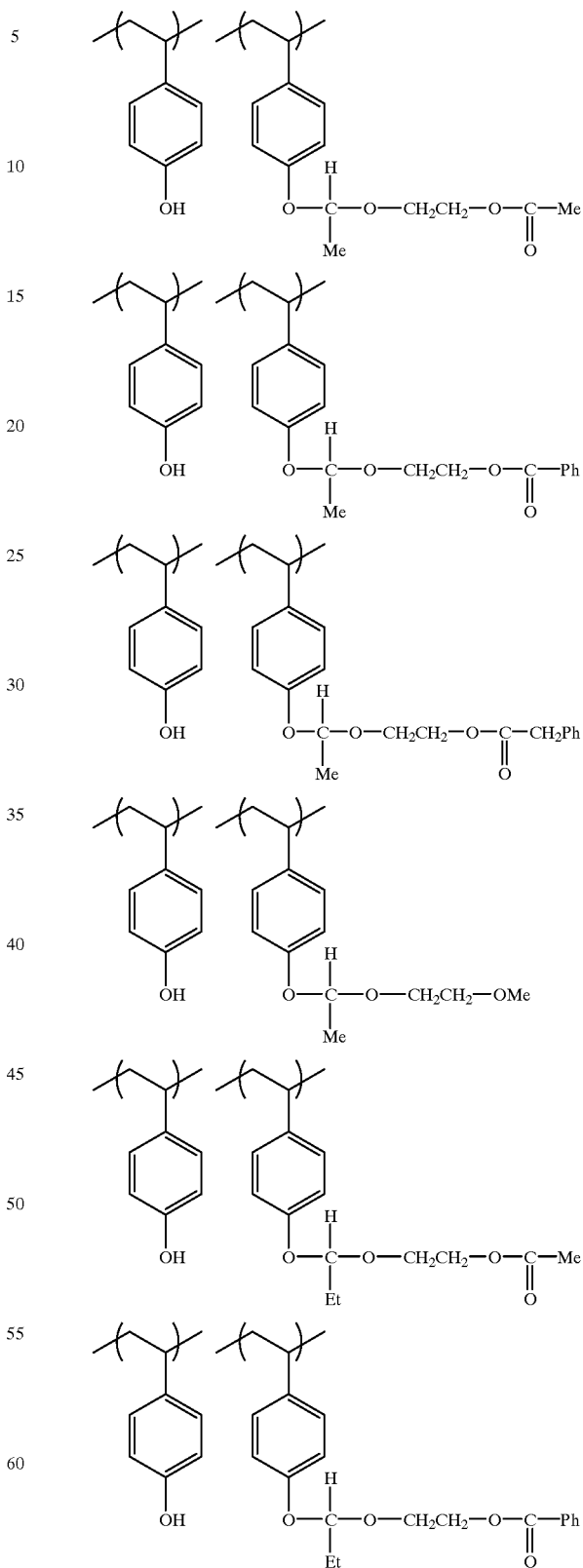

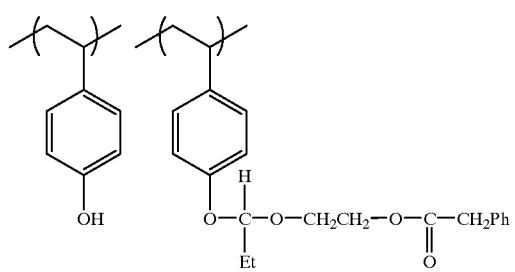
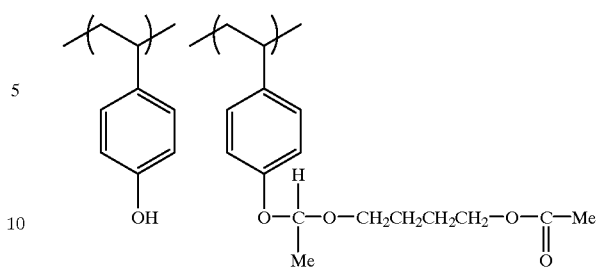
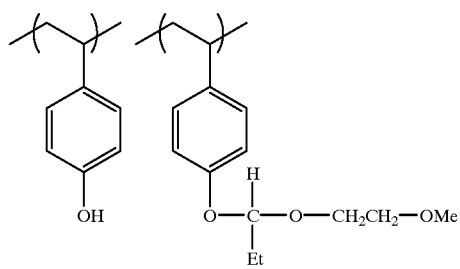
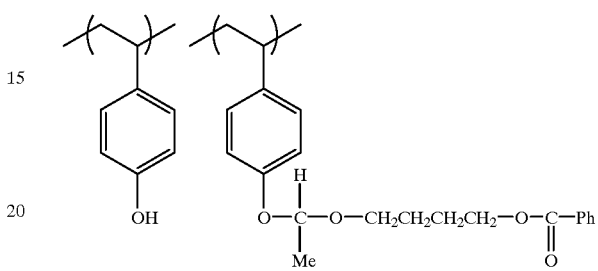
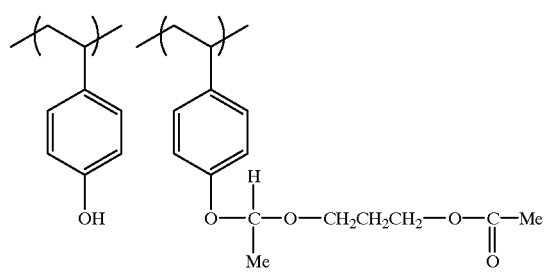
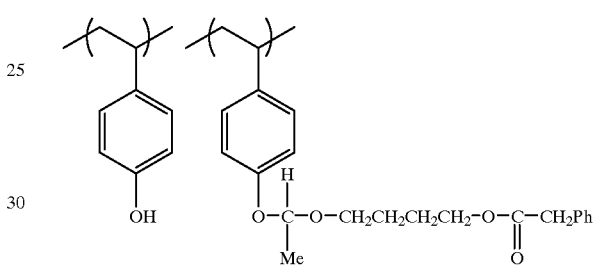
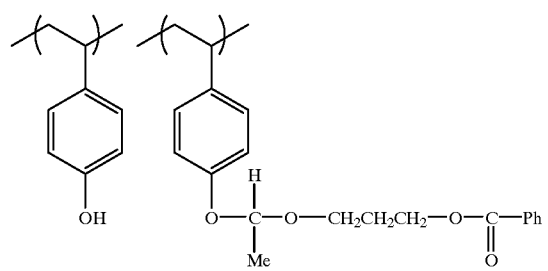
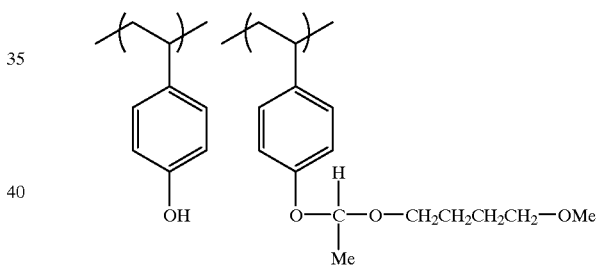
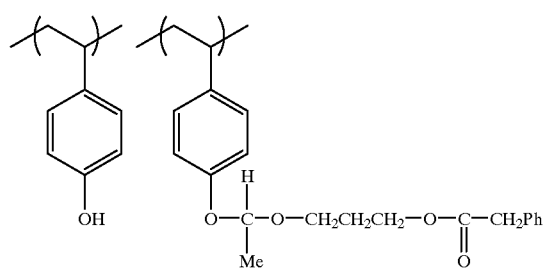
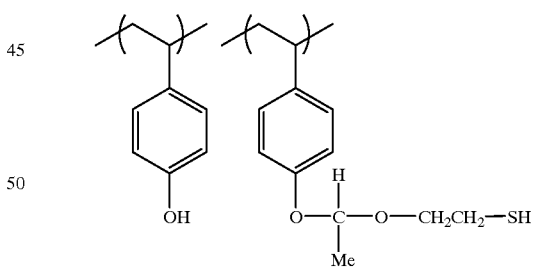
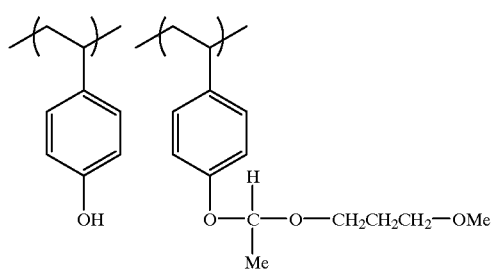
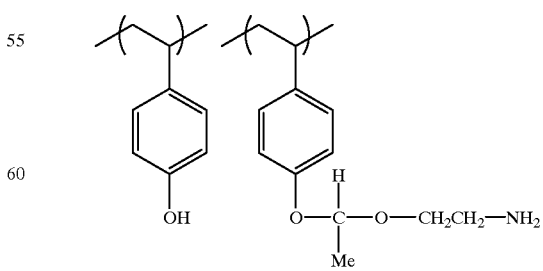

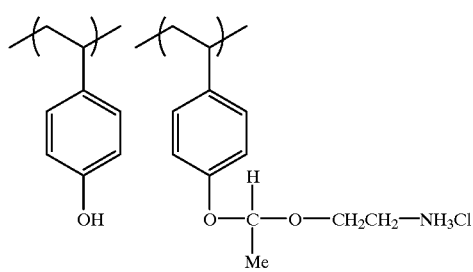
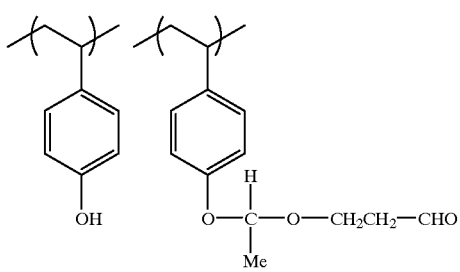
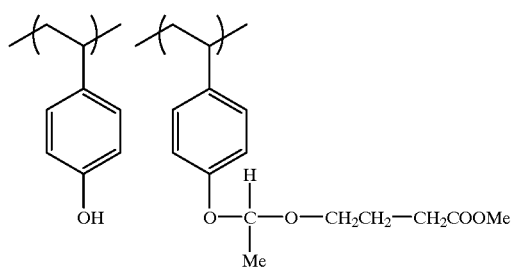
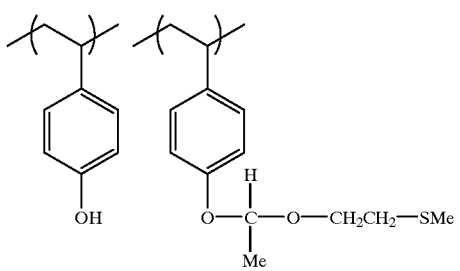
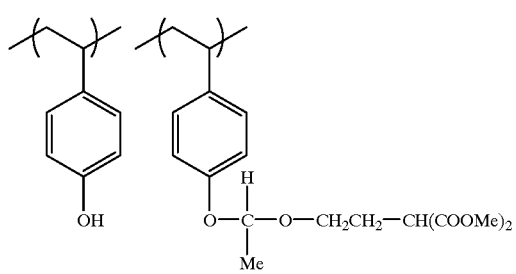
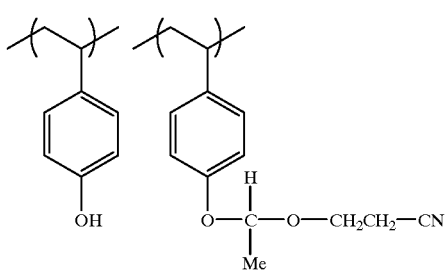
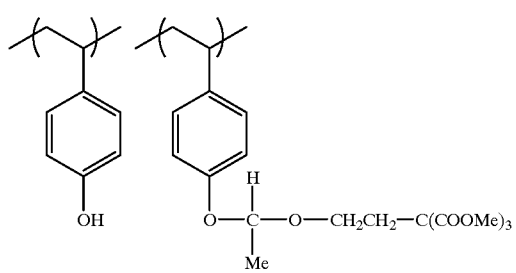
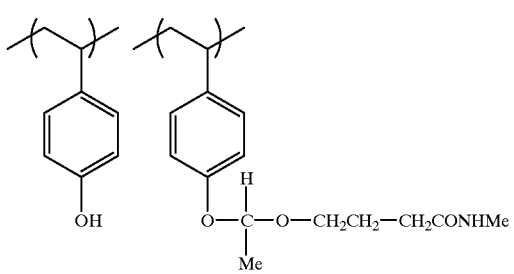
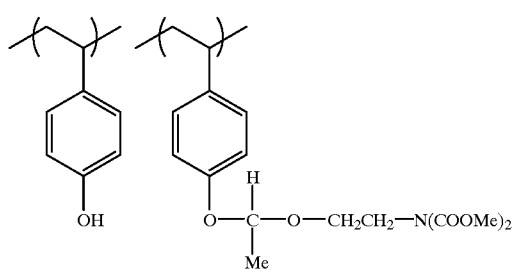
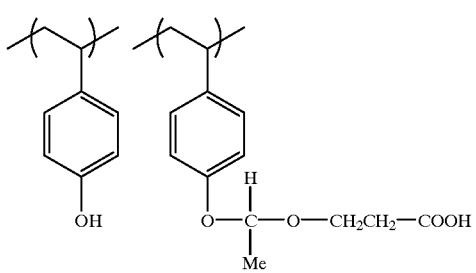
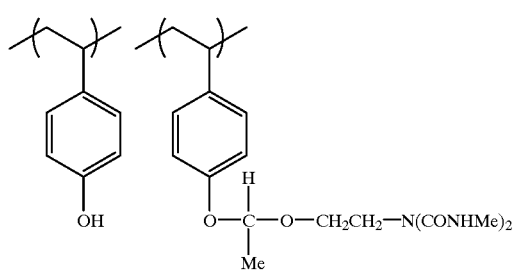
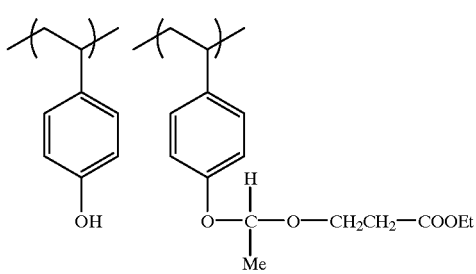

-continued
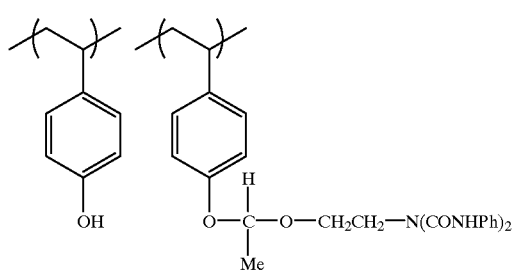
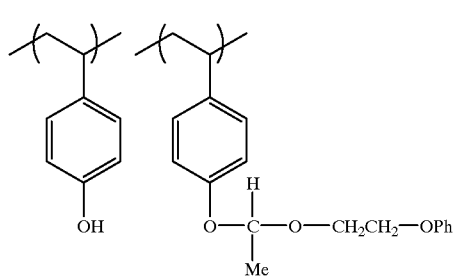
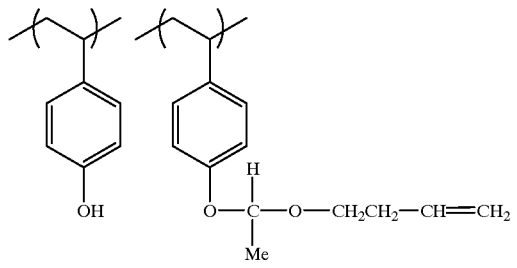
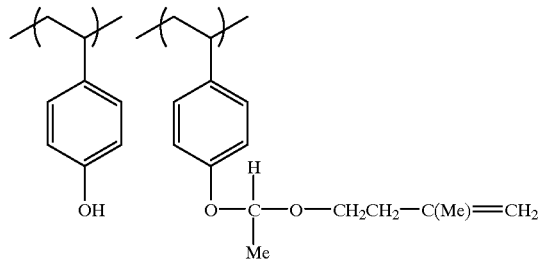
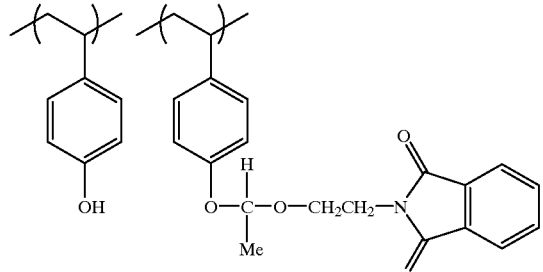
-continued
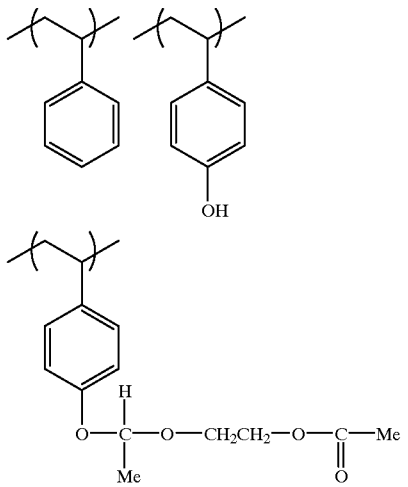

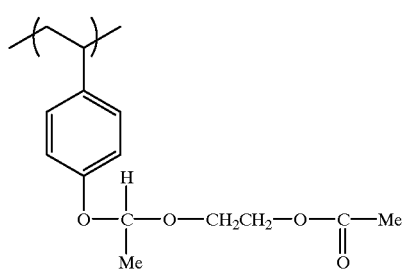
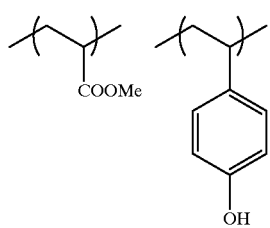
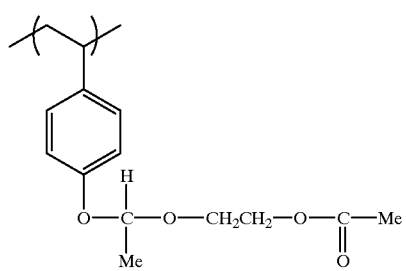
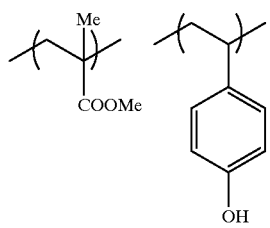
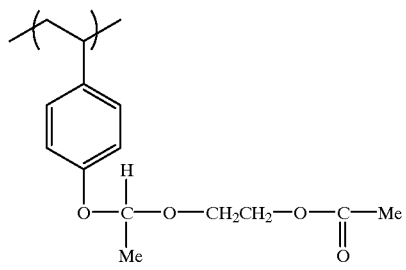
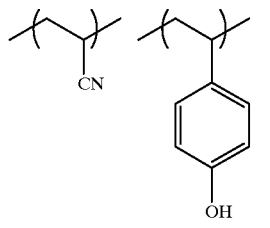
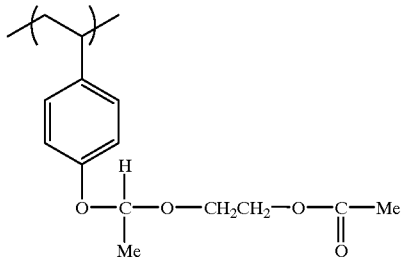
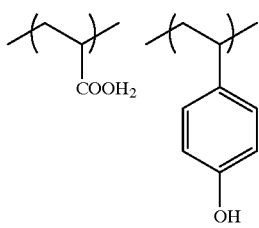
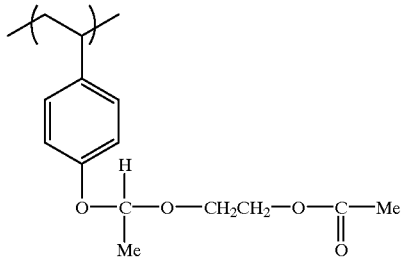
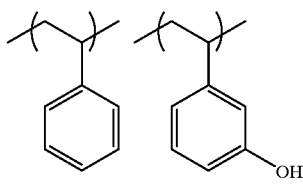
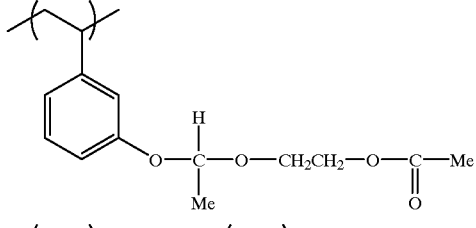
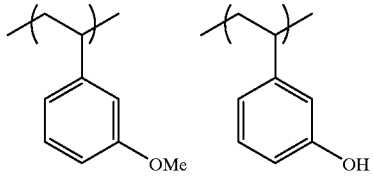
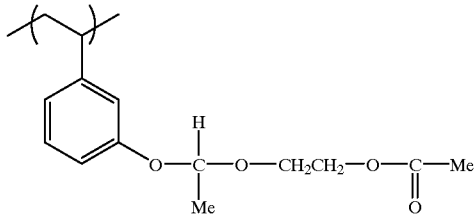

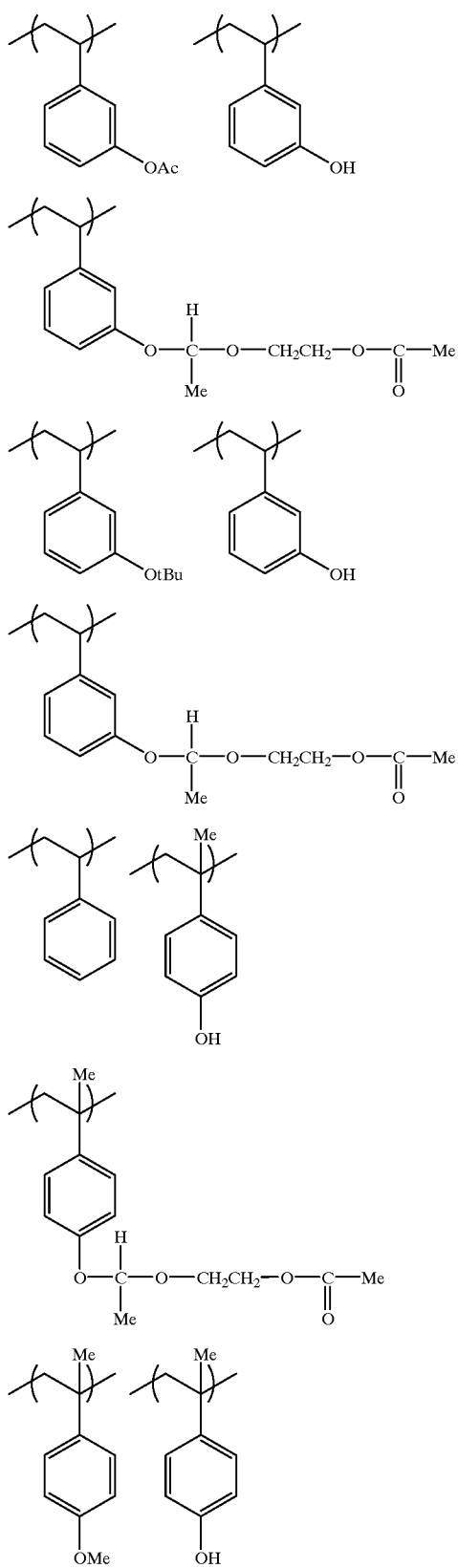
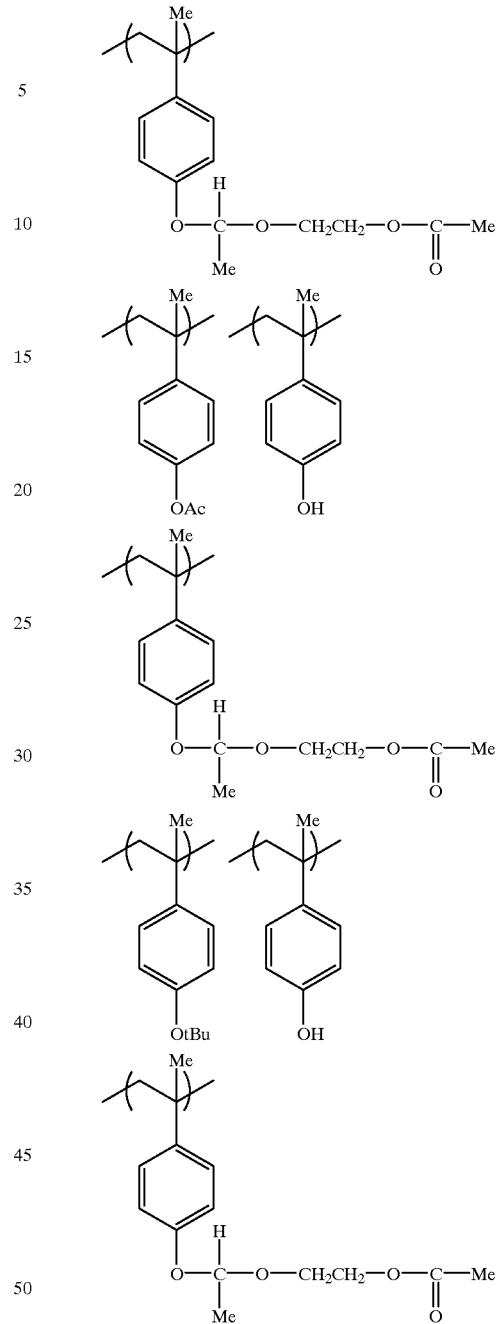

From 10 to 80% of the phenolic hydroxyl groups of the alkali-soluble resin should be replaced with substituents represented by general formula (I) according to the present invention. The degree of this replacement is preferably from 15 to 60%, more preferably from 20 to 40%.

If the degree of replacement of the phenolic hydroxyl groups with groups represented by general formula (I) is lower than 10%, a sufficient difference in the rate of dissolution in alkali cannot be obtained between exposed and unexposed areas, resulting in reduced resolution. If the degree of that replacement exceeds 80%, especially heat resistance decreases. Thus, such too high or too low degrees of replacement are unusable for the present invention.

The resin used in the present invention, which is obtained by protecting phenolic hydroxyl groups (alkali solubilizing groups) of the alkali-soluble resin with specific acid-decomposable groups represented by general formula (I), is a novel resin, having groups which decompose by the action of an acid to enhance solubility in an alkaline developing solution.

A mixture of two or more resins of the above-described specific structure according to the present invention may be used. The use amount of these resins in the present invention is from 40 to 99% by weight, preferably from 60 to 97% by weight, based on the total amount of the photosensitive composition (excluding the solvent).

It is possible to incorporate an alkali-soluble resin not containing acid-decomposable groups into the composition of the present invention to thereby improve sensitivity. This alkali-soluble resin not containing acid-decomposable groups (hereinafter referred to simply as "alkali-soluble resin") needs to be alkali-soluble. Preferred examples thereof include poly(hydroxystyrene), a novolak resin, or a derivative thereof. More preferred examples include an alkali-soluble resin comprising p-hydroxystyrene units (more preferably poly(p-hydroxystyrene, a p-hydroxystyrene/m-hydroxystyrene copolymer, a p-hydroxystyrene/o-hydroxystyrene copolymer, or a p-hydroxystyrene/styrene copolymer), an alkyl-substituted hydroxy resin (e.g., a 4-hydroxy-3-methylstyrene resin or a 4-hydroxy-3,5-dimethylstyrene resin), or a resin obtained from any of the above resins by converting OH groups thereof into alkyl or acetyl groups.

A resin obtained from any of the resins enumerated above by hydrogenating part of the phenol nuclei (up to 30 mol % of all phenol nuclei) is preferred in that it has improved transparency and is advantageous in sensitivity, resolution, and the formation of a rectangular profile.

Examples of the alkali-soluble resin for use in the present invention include novolak resins, hydrogenated novolak resins, acetone-pyrogallol resins, poly(hydroxystyrene), alkyl-substituted poly(hydroxystyrene)s, hydroxystyrene/N-substituted maleimide copolymers, partially O-alkylated or O-acylated poly(hydroxystyrene)s, styrene/maleic anhydride copolymers, carboxylated methacrylic resins and derivatives thereof, styrene/polyhydroxystyrene copolymers, and hydrogenated poly(hydroxystyrene)s. However, the alkali-soluble resin for use in the present invention should not be construed as being limited to these examples.

Especially preferred alkali-soluble resins for use in the present invention are novolak resins, alkali-soluble resins comprising p-hydroxystyrene units (more preferably poly (p-hydroxystyrene), p-hydroxystyrene/m-hydroxystyrene copolymers, p-hydroxystyrene/o-hydroxystyrene copolymers, and p-hydroxystyrene/styrene copolymers), alkyl-substituted hydroxy resins such as 4-hydroxy-3-methylstyrene resins and 4-hydroxy-3,5-dimethylstyrene resins, resins obtained from the above resins by converting OH groups thereof into alkyl or acetyl groups, partially hydrogenated poly(hydroxystyrene) resins, poly (hydroxystyrene) resins, partially hydrogenated novolak resins, and partially hydrogenated poly(hydroxystyrene) resins.

The term "poly(hydroxystyrene)" used herein means a polymer obtained by polymerizing at least one monomer selected from p-hydroxystyrene, m-hydroxystyrene, o-hydroxystyrene, and these hydroxystyrenes substituted in an ortho position with an alkyl group having 1 to 4 carbon atoms.

The novolak resins are obtained by subjecting at least one given monomer as the main ingredient to addition condensation with at least one aldehyde in the presence of an acid catalyst.

Examples of the given monomer include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including dihydroxybiphenyl, bisphenol A, phenylphenol, resorcinol, and naphthol. These compounds may be used alone or as a mixture of two or more thereof. The main monomer for novolak resins should not be construed as being limited to the above examples.

Examples of the aldehyde include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, O-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and acetals derived from these. Preferred among these is formaldehyde.

These aldehydes may be used alone or in combination of two or more thereof. Examples of the acid catalyst include sulfuric acid, formic acid, acetic acid, and oxalic acid.

The content of the alkali-soluble resin not containing acid-decomposable groups is generally up to 50% by weight, preferably up to 30% by weight, more preferably up to 20% by weight, based on the total amount of the alkali-soluble resin not containing acid-decomposable groups and the resin containing acid-decomposable groups.

The photo-acid generator for use in the present invention is a compound which generates an acid upon irradiation with actinic rays or a radiation.

Examples of the compound which decomposes upon irradiation with actinic rays or a radiation to generate an acid include photoinitiators for cationic photopolymerization, photoinitiators for radical photopolymerization, photodecolorants for dyes, optical color changers, and compounds which generate an acid by the action of a light known to be used, e.g., for microresist production (e.g., 400–200 nm ultraviolet rays, far ultraviolet rays, especially preferably g-, h-, or i-lines, or KrF excimer laser beams) or of ArF excimer laser beams, electron beams, X-rays, molecular beams, or ion beams. One or more photo-acid generators are suitably selected from those and used alone or as a mixture thereof.

Other examples of the compound which generates an acid upon irradiation with actinic rays or a radiation for use in the present invention include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Pat. No. Reissued 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, October (1988), and U.S. Pat. Nos. 4,069,055 and 4,069,056; the iodonium salts described in, e.g., J. V. Crivello et al., *Macromorecules,* 10 (6), 1307 (1977), *Chem. & Eng. News,* November 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.,* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromorecules,* 14 (5), 1141 (1981), J. V. Crivello et al., *J. Polymer Sci., Polymer Chem. Ed.,* 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, and German Patents 2,904,626, 3,604,580, and 3,604,581; the selenonium salts described in, e.g., J. V. Crivello et al., *Macromorecules,* 10 (6), 1307 (1977) and J. V. Crivello et al., *J. Polymer Sci., Polymer Chem. Ed.,* 17, 1047 (1979); and the arsonium salts described in, e.g., C. S. Wen et al., *Teh, Proc. Conf. Rad. Curing ASIA,* p. 478 Tokyo, October (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896), and JP-A-2-161445; the photo-acid generators having an o-nitrobenzyl type protective group described in, e.g., S. Hayase et al., *J. Polymer Sci.,* 25, 753 (1987), E. Reichmanis et al., *J. Pholymer Sci., Polymer Chem. Ed.,* 23, 1 (1985), Q. Q. Zhu et al., *J. Photochem.,* 36, 85, 39, 317 (1987), B. Amit et al., *Tetrahedron Lett.,* (24) 2205 (1973), D. H. R. Barton et al., *J. Chem. Soc.,* 3571 (1965), P. M. Collins et al., *J. Chem. Soc., Perkin I,* 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc., Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al., *Macromolecules,* 21, 2001 (1988), European Patents 0,290,750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints,* Japan, 35 (8), G. Berner et al., *J. Rad. Curing,* 13 (4), W. J. Mijs et al., *Coating Technol.,* 55 (697), 45 (1983), Akzo, H. Adachi et al., *Polymer Preprints,* Japan, 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Furthermore, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.,* 104, 5586 (1982), S. P. Pappas et al., *J. Imaging Sci.,* 30 (5), 218 (1986), S. Kondo et al., *Makromol. Chem., Rapid Commun.,* 9, 625 (1988), Y. Yamada et al., *Makromol. Chem.,* 152, 153, 163 (1972), J. V. Crivello et al., *J. Polymer Sci., Polymer Chem. Ed.,* 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis,* (1), 1 (1980), A. Abad et al., *Tetrahedron Lett.,* (47) 4555 (1971), D. H. R. Barton et al., *J. Chem. Soc.,* (C), 329 (1970), U.S. Pat. No. 3,779,778, and European Patent 126,712.

Among the compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

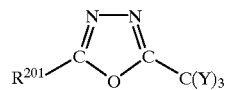

(PAG1)

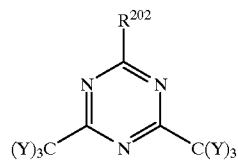

(PAG2)

In the above formulae, $R^{201}$ represents a substituted or unsubstituted aryl or alkenyl group; $R^{202}$ represents a substituted or unsubstituted aryl, alkenyl, or alkyl group or —C(Y)$_3$; and Y represents a chlorine or bromine atom.

Specific examples thereof are given below, but the compounds represented by general formula (PAG1) or (PAG2) should not be construed as being limited thereto.

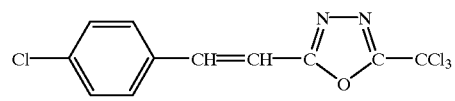

(PAG1-1)

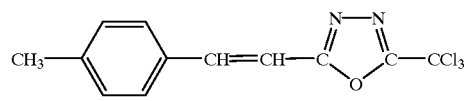

(PAG1-2)

-continued
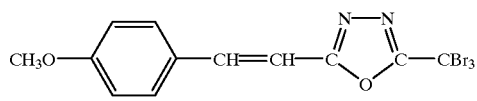
(PAG1-3)
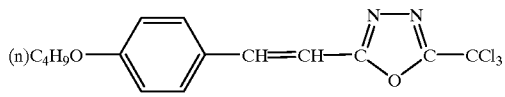
(PAG1-4)
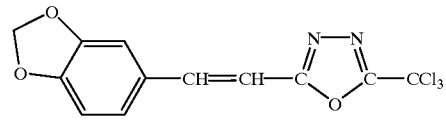
(PAG1-5)
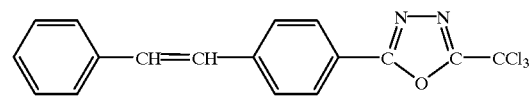
(PAG1-6)
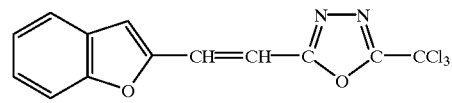
(PAG1-7)
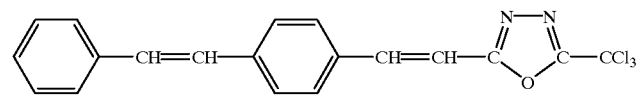
(PAG1-8)
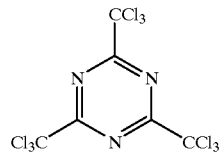
(PAG2-1)
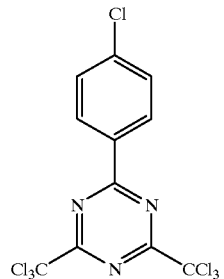
(PAG2-2)
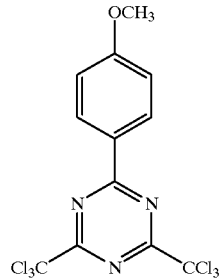
(PAG2-3)

-continued
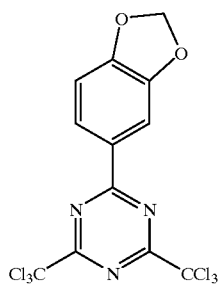
(PAG2-4)
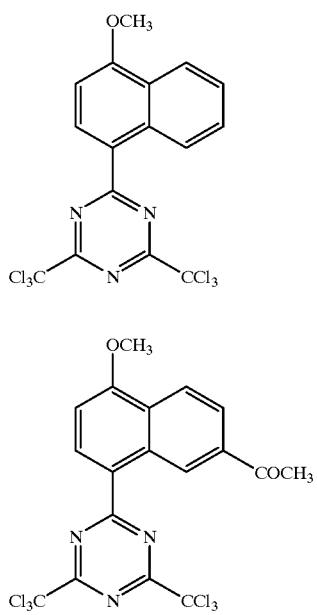
(PAG2-5)
(PAG2-6)
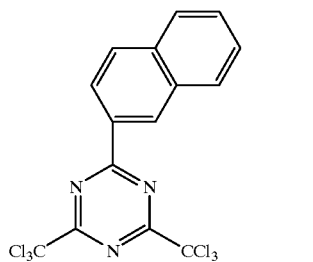
(PAG2-7)
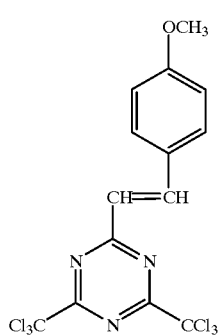
(PAG2-8)

-continued

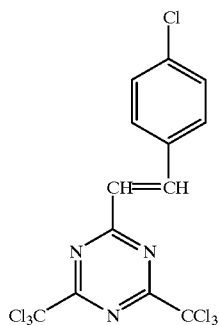

(PAG2-9)

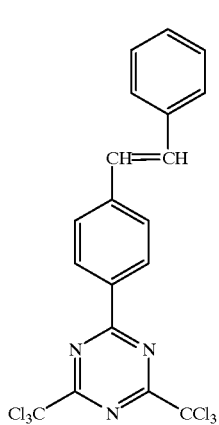

(PAG2-10)

(2) Iodonium salts represented by the following general formula (PAG3) and sulfonium salts represented by the following general formula (PAG4).

(PAG3)

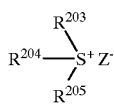

(PAG4)

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, cycloalkyl groups, nitro, carboxyl, mercapto, hydroxy, and halogen atoms. Preferred substituents for the alkyl group include alkoxy groups having 1 to 8 carbon atoms, carboxyl, and alkoxycarbonyl groups.

$Z^-$ represents a counter anion. Examples thereof include perfluoroalkanesulfonate anions, e.g., $BF_4^-$, $AsF_6^-$, $PF_6^-$, $SbF_6^-$, $SiF_6^{2-}$, $ClO_4^-$, and $CF_3SO_3^-$, a pentafluorobenzenesulfonate anion, fused-ring aromatic sulfonate anions, e.g., a naphthalene-1-sulfonate anion, an anthraquinonesulfonate anion, and dyes containing a sulfonate group. However, the counter anion should not be construed as being limited to these examples.

Two of $R^{203}$, $R^{204}$, and $R^{205}$ may be bonded to each other through a single bond or substituent thereof. $Ar^1$ and $Ar^2$ may be bonded to each other likewise.

It is preferred to use a photo-acid generator which is less apt to cause the resist film to undergo a performance change (e.g., the formation of a T-top surface or a line width change) with the lapse of time from exposure to heat treatment. For example, such a photo-acid generator is represented by general formula (PAG3) or (PAG4) wherein $Ar_1$, $Ar_2$, and $R^{203}$ to $R^{205}$ each represents a substituted or unsubstituted aryl group and $Z^-$ is an anion which, when converted to an acid upon irradiation with light, has relatively low diffusibility in the resist film. Specifically, this $Z^-$ represents a benzenesulfonate, naphthalenesulfonate, or anthracenesulfonate anion which has at least one group selected from the group consisting of branched or cyclic, alkyl or alkoxy groups having 8 or more carbon atoms, or has at least two groups selected from the group consisting of linear, branched, or cyclic, alkyl or alkoxy groups having 4 to 7 carbon atoms, or has at least three groups selected from the group consisting of linear or branched, alkyl or alkoxy groups having 1 to 3 carbon atoms.

Specific example thereof are given below, but the compounds represented by general formula (PAG3) or (PAG4) should be construed as being limited thereto.

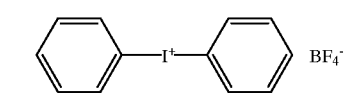 (PAG3-1) BF4⁻
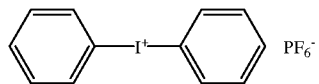 (PAG3-2) PF6⁻
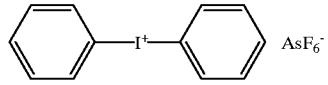 (PAG3-3) AsF6⁻
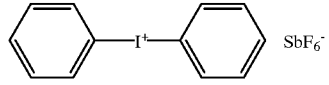 (PAG3-4) SbF6⁻
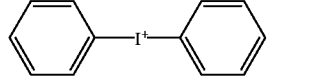 (PAG3-5) CF3SO3⁻
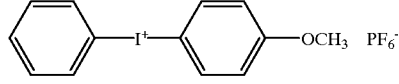 (PAG3-6) PF6⁻
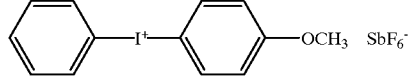 (PAG3-7) SbF6⁻
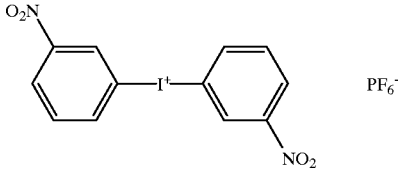 (PAG3-8) PF6⁻
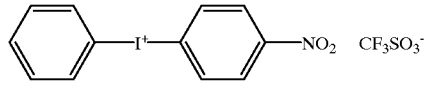 (PAG3-9) CF3SO3⁻
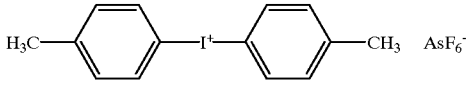 (PAG3-10) AsF6⁻
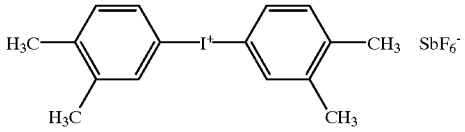 (PAG3-11) SbF6⁻
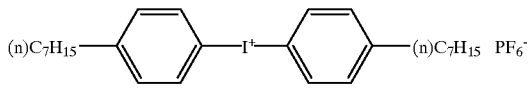 (PAG3-12) PF6⁻
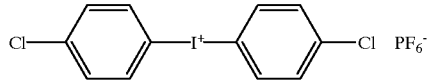 (PAG3-13) PF6⁻
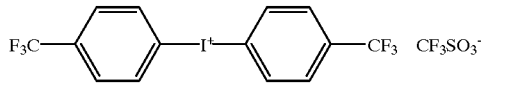 (PAG3-14) CF3SO3⁻
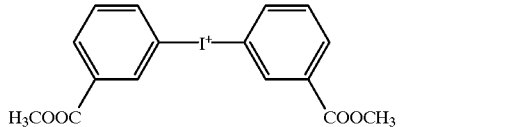 (PAG3-15)
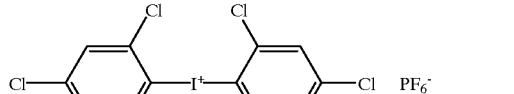 (PAG3-16) PF6⁻
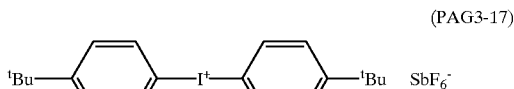 (PAG3-17) SbF6⁻
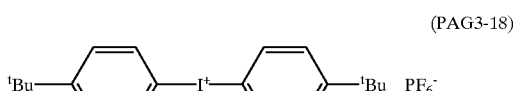 (PAG3-18) PF6⁻
 (PAG3-19) PF6⁻
 (PAG3-20) CF3SO3⁻
 (PAG3-21) CF3SO3⁻
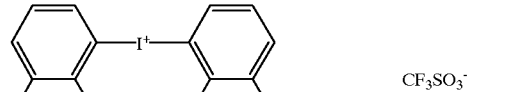 (PAG3-22)
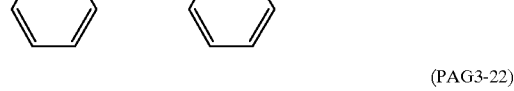
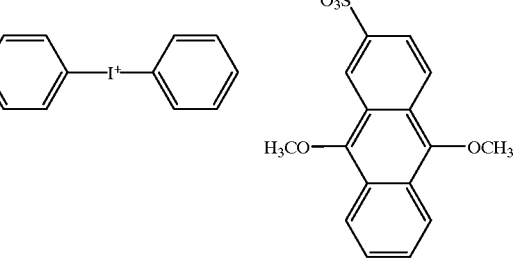

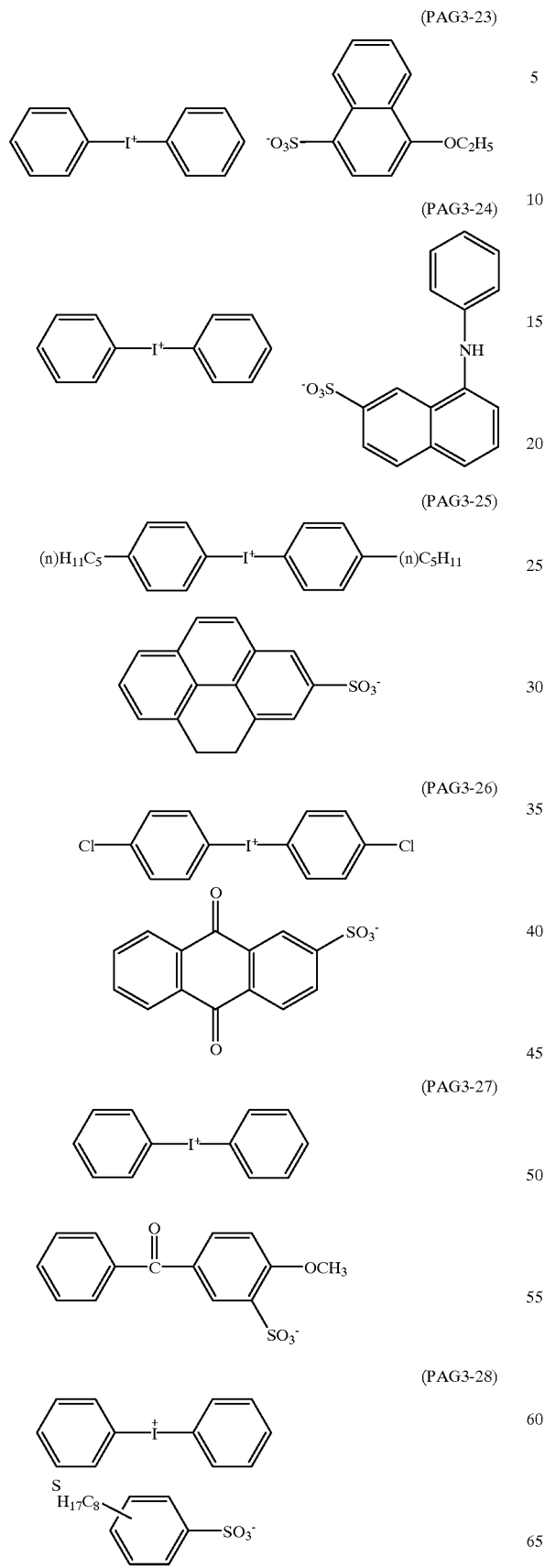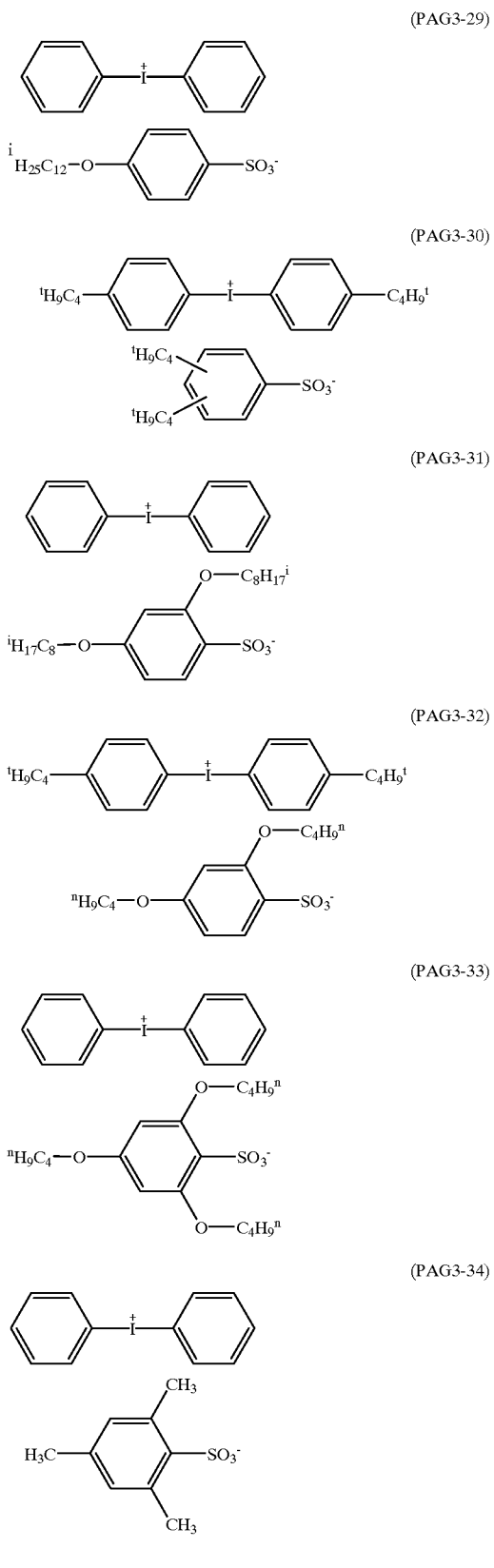

(PAG3-35)
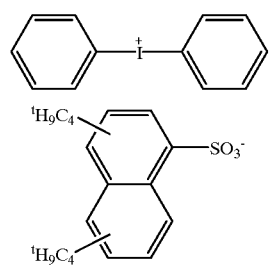
(PAG3-36)
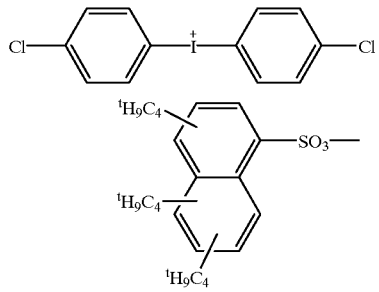
(PAG3-37)
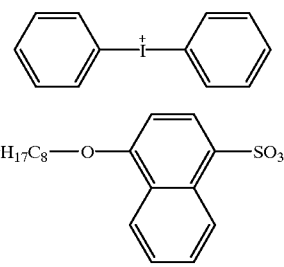
(PAG3-38)
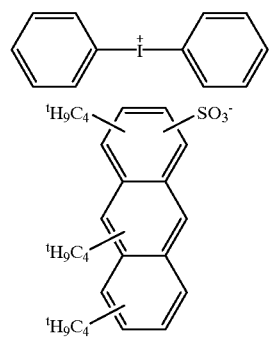
(PAG3-39)
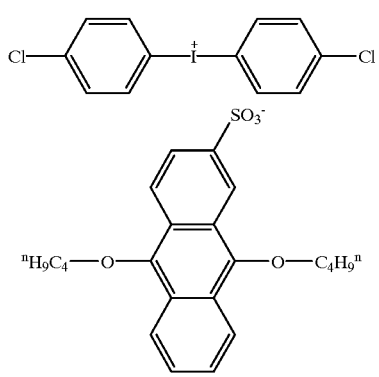
(PAG3-40)
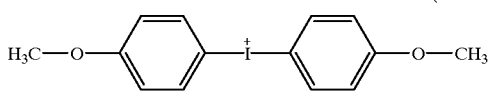
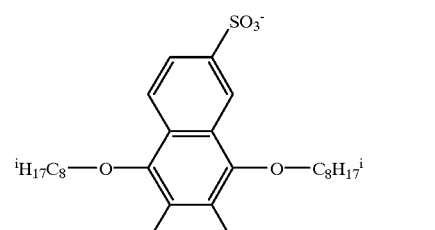
(PAG4-1)
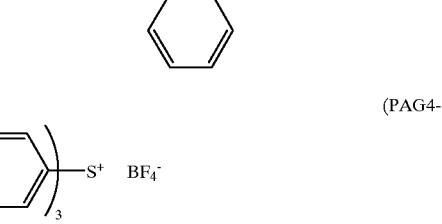
(PAG4-2)
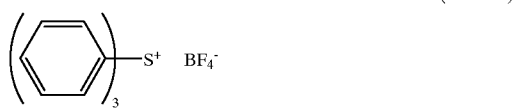
(PAG4-3)
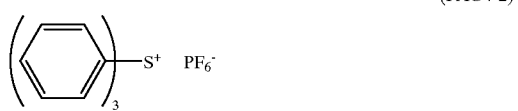
(PAG4-4)
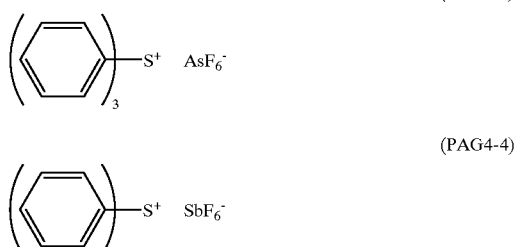
(PAG4-5)
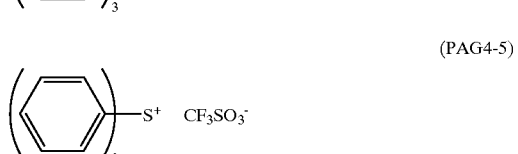
(PAG4-6)
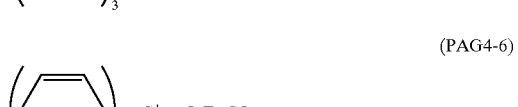
(PAG4-7)
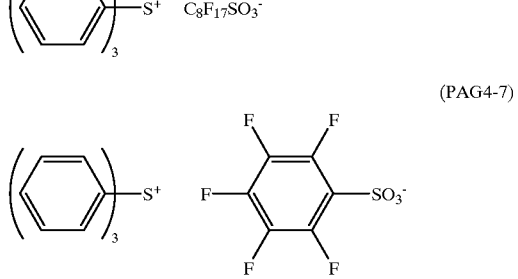
(PAG4-8)
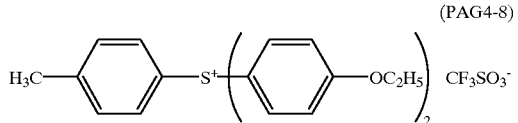

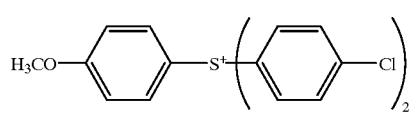 (PAG4-9) CF₃SO₃⁻
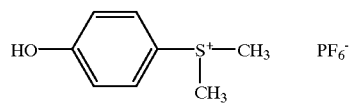 (PAG4-10) PF₆⁻
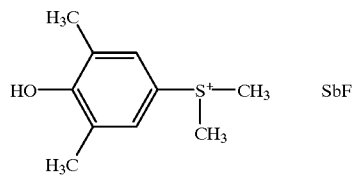 (PAG4-11) SbF₆⁻
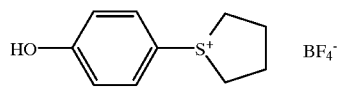 (PAG4-12) BF₄⁻
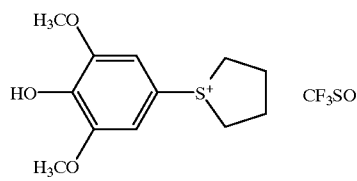 (PAG4-13) CF₃SO₃⁻
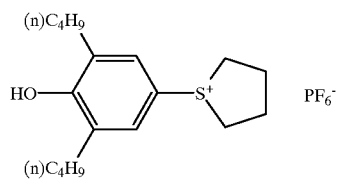 (PAG4-14) PF₆⁻
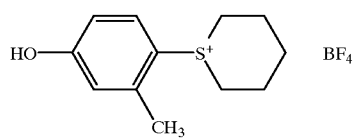 (PAG4-15) BF₄⁻
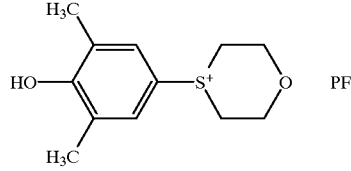 (PAG4-16) PF₆⁻
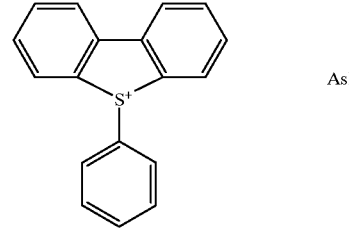 (PAG4-17) AsF₆⁻
(PAG4-18) C₈F₁₇SO₃⁻
(PAG4-19) SbF₆⁻
(PAG4-20) PF₆⁻
(PAG4-21) AsF₆⁻
(PAG4-22) AsF₆⁻
(PAG4-23) PF₆⁻
(PAG4-24) AsF₆⁻
(PAG4-25) PF₆⁻
(PAG4-26) C₈H₁₇SO₃⁻
(PAG4-27) SbF₆⁻

(PAG4-28) 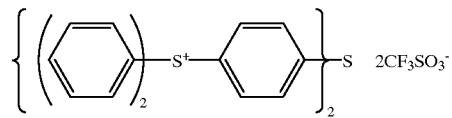
(PAG4-29) 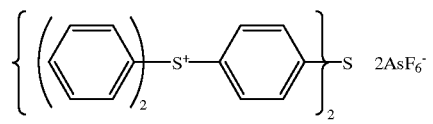
(PAG4-30) 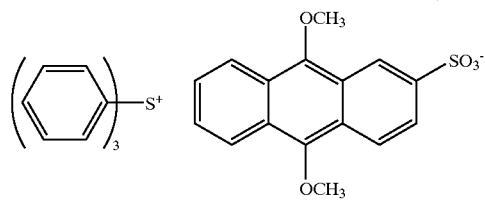
(PAG4-31) 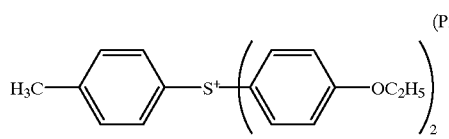
(PAG4-32) 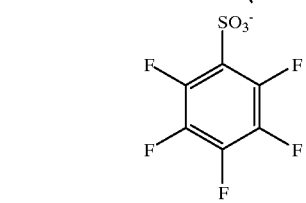
(PAG4-33) 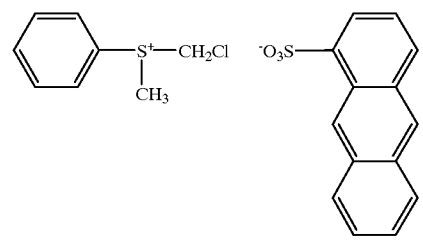
(PAG4-34) 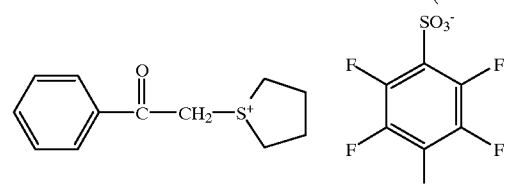
(PAG4-35) 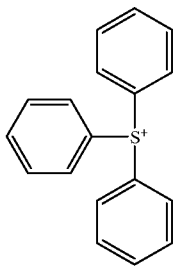 
(PAG4-36) 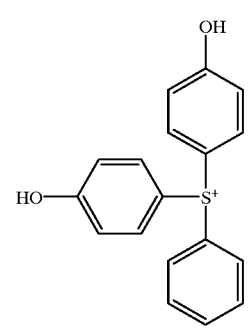 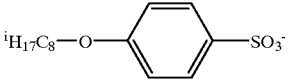
(PAG4-37) 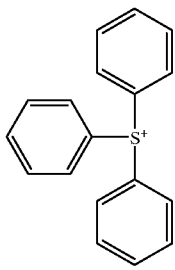 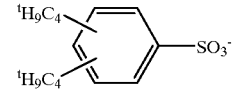
(PAG4-38) 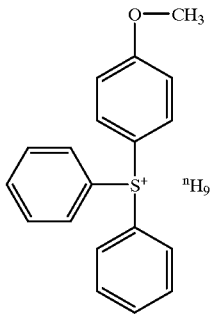 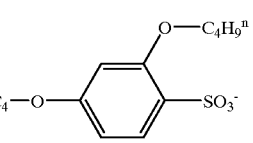
(PAG4-39) 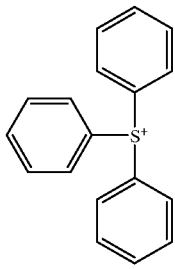 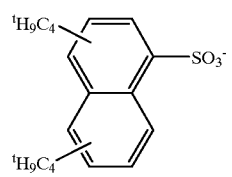

(PAG4-40)
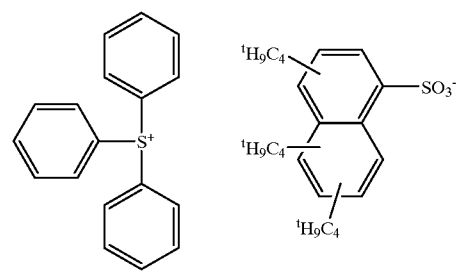

(PAG4-41)
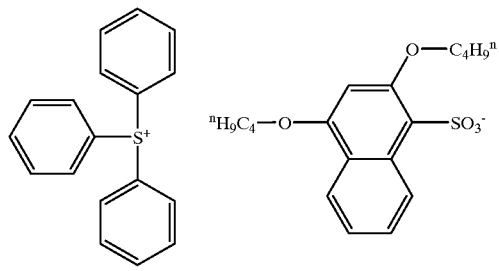

(PAG4-42)
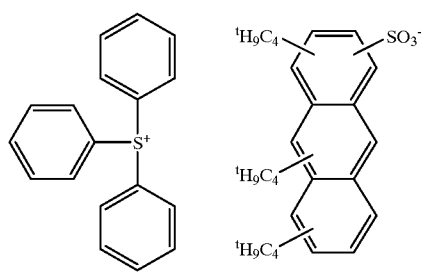

(PAG4-43)
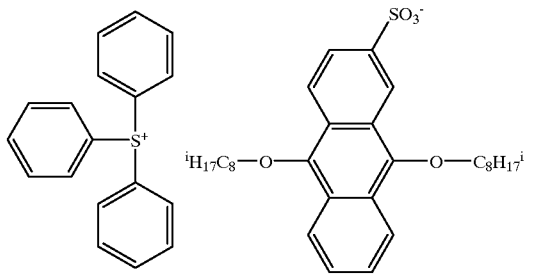

(PAG4-44)
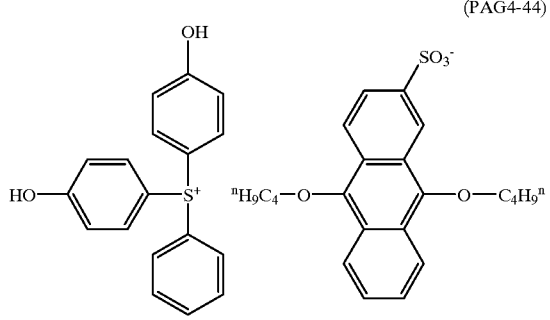

(PAG4-45)
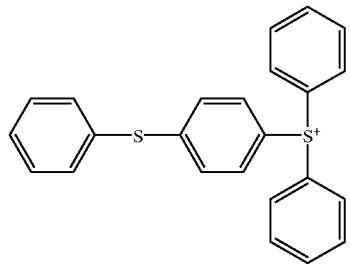

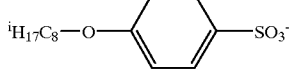

(PAG4-46)
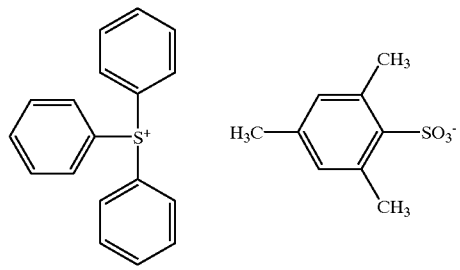

(PAG4-47)
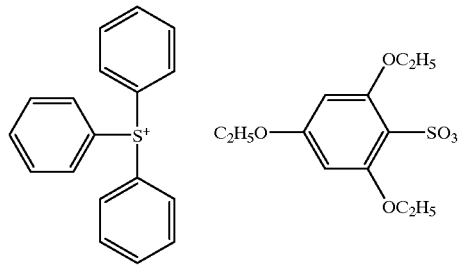

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

(PAG5)

$Ar^3$—$SO_2$—$SO_2$—$Ar^4$ (PAG6)

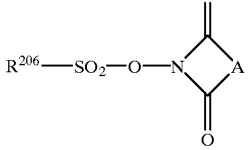

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

(PAG5-1)
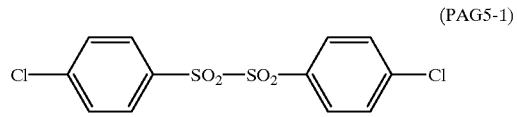

(PAG5-2)

(PAG5-3)
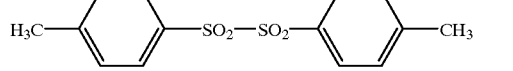

(PAG5-4)

(PAG5-5)
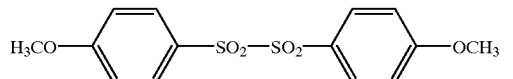

(PAG5-6)

(PAG5-7)

(PAG5-8)
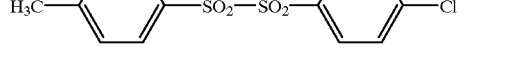

(PAG5-9)

(PAG5-10)
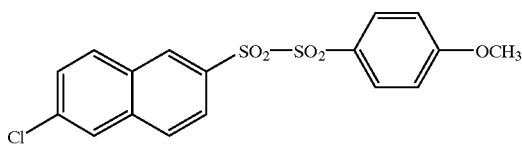

(PAG5-11)
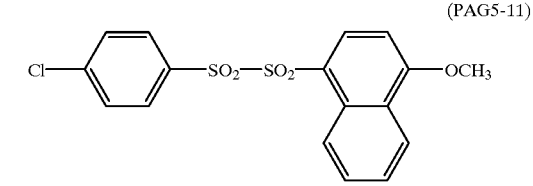

(PAG5-12)
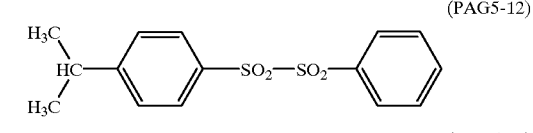

(PAG5-13)
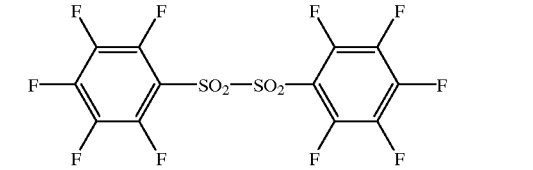

(PAG5-14)
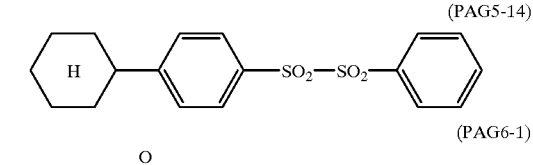

(PAG6-1)
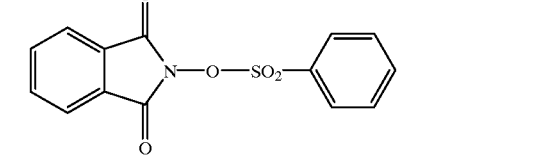

(PAG6-2)
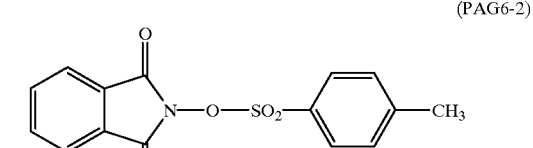

(PAG6-3)

(PAG6-4)
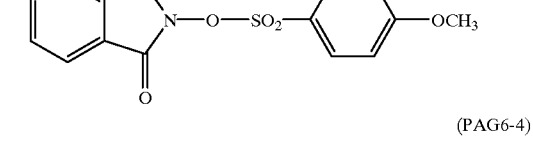

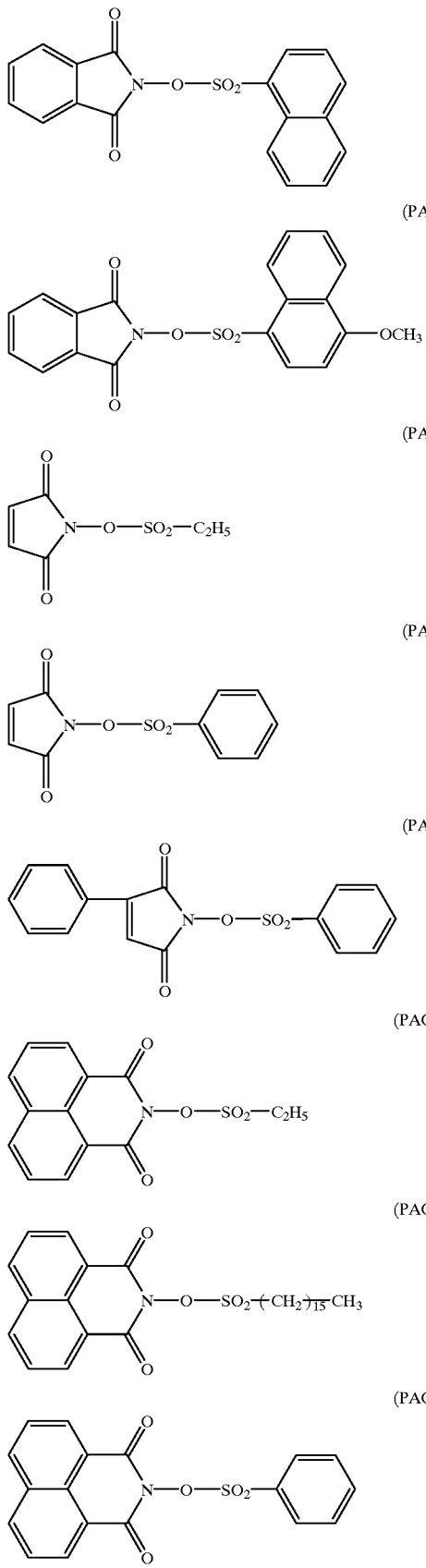

(PAG6-5)
(PAG6-6)
(PAG6-7)
(PAG6-8)
(PAG6-9)
(PAG6-10)
(PAG6-11)
(PAG6-12)

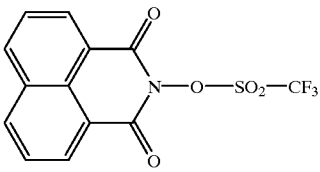
(PAG6-13)

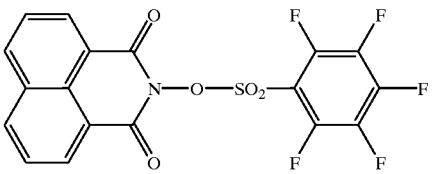
(PAG6-14)

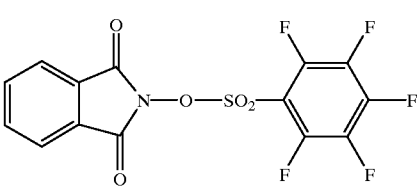
(PAG6-15)

In the present invention, the compound which generates an acid upon irradiation with actinic rays or a radiation is preferably an onium salt, a disulfone, a 4-DNQ sulfonic ester, or a triazine compound.

The addition amount of these compounds which decompose upon irradiation with actinic rays or a radiation to generate an acid is generally from 0.001 to 40% by weight, preferably from 0.01 to 20% by weight, more preferably from 0.1 to 5% by weight, based on the total amount of the photosensitive composition (excluding the solvent). If the addition amount of the compounds decomposing upon irradiation with actinic rays or a radiation to generate an acid is smaller than 0.001% by weight, sensitivity is reduced. If the addition amount thereof exceeds 40% by weight, the resist comes to show too high light absorption. Thus, such too large or too small addition amounts thereof are undesirable in that the results are an impaired profile and a narrowed margin for processing (especially baking).

An organic basic compound can be used for the composition of the present invention. The incorporation of this compound is preferred in that it serves to improve storage stability and reduce the line width change caused by PED (lapse of the time from exposure to baking).

Preferred organic basic compounds that can be used in the present invention are compounds having higher basicity than phenol. More preferred among these are nitrogen-containing basic compounds.

Preferred examples of the chemical environment thereof include the following structures (A) to (E).

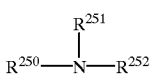

(A)

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

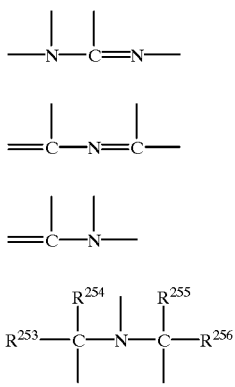

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The added amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the effects of the present invention cannot be obtained. On the other hand, if it exceeds 10 parts by weight, reduced sensitivity and impaired developability at unexposed parts are liable to be caused.

The chemically amplified positive resist composition can further contain surfactants, dyes, pigments, plasticizers, spectral sensitizers, compounds having two or more phenolic OH groups, which can promote the dissolution in a developing solution, and the like, if needed.

Preferred examples of the surfactant include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate); fluorine-containing surfactants, such as Eftop EF301, EF303 and EF352 (commercial names, products of Shin-Akita Kasei K.K.), Megafac F171 and F173 (commercial names, products of Dai-Nippon Ink & Chemicals, Inc.), Florade FC430 and FC431 (commercial names, products of Sumitomo 3M Co., Ltd.), Asahi Guard AG710, Surflon S-382, SC101, SC102, SC103, SC104, SC105 and SC106 (commercial names, products of Asahi Glass Company, Ltd.); organosiloxane polymers, such as KP341 (produced by Shin-Etsu Chemical Co., Ltd.); and acrylic or methacrylic acid (co)polymers, such as Polyflow No. 75 and No. 95 (commercial names, products of Kyoeisha Yushi Kagaku Kogyo K.K.). The surfactant may be added alone or as a mixture of two or more thereof. The amount of the surfactant is preferably from 0.0005 to 0.01 part by weight, per 100 parts by weight of the composition (excluding the solvent).

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to exhibit absorption in a region of longer wavelengths than far ultraviolet, whereby the photosensitive composition of the present invention can be rendered sensitive to an i- or g-line. Examples of spectral sensitizers suitable for use in the present invention include benzophenone, p,p'-tetramethyldiaminobenzophenone, p,p'-tetraethylethylamino-benzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tertbutylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

Examples of the compound having two or more phenolic OH groups capable of accelerating dissolution in a developing solution include polyhydroxy compounds. Preferred examples of the polyhydroxy compounds include phenols, resorcinol, phloroglucinol, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)cyclohexane.

The chemically amplified positive resist composition of the present invention is applied to a substrate after having been dissolved in a solvent in which the ingredients described above are soluble. Preferred examples of the solvent that can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture thereof.

A satisfactory resist pattern can be obtained by applying the chemically amplified positive resist composition described above on a substrate such as those for use in the production of precision IC elements (e.g., silicon/silicon dioxide coating) by an appropriate coating means, e.g., a spinner or coater, exposing the coating to light through a mask, and then baking and developing the coating.

As a developing solution for the chemically amplified positive resist composition of the present invention, an aqueous solution of an alkali can be used. Examples of the alkali include inorganic alkalis such as sodium hydroxide, potassium hydroxide, sodium carbonate, sodium silicate, sodium phosphate, sodium metasilicate, and ammonia water, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, amides such as formamide and acetamide, quaternary ammonium salts such as tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide, and tetrabutylammonium hydroxide, and cyclic amines such as pyrrole and piperidine.

The present invention will be explained below in more detail by reference to Examples, but the invention should not be construed as being limited thereto.

Synthesis Example I-1
Synthesis of Vinyl Ether

A 256 g (2.4 mol) portion of chloroethyl vinyl ether was mixed with 82 g (1.0 mol) of sodium acetate and 2 g of tetra-n-butylammonium iodide. This mixture was heated with refluxing at 80 to 90° C. for 8 hours. After the reaction mixture was cooled to room temperature, the salt generated was taken out of the reaction mixture by filtration and extracted with 200 ml of diethyl ether. This ether extract was added to the reaction mixture, and the ether and the chloroethyl vinyl ether remaining unreacted were removed with an evaporator.

The oily residue obtained was subjected twice to vacuum distillation in the presence of calcium hydride to obtain 2-acetoxyethyl vinyl ether, which is a colorless compound represented by the following formula X-1.

Synthesis Examples I-2, I-3, and I-4

Three vinyl ethers were synthesized using N,N-dimethylformamide as a solvent in the same manner as in Synthesis Example I-1 (through recrystallization from methanol). That is, ethyl(2-(vinyloxy)ethyl)malonate represented by the following formula X-2 was obtained from chloroethyl vinyl ether and sodium diethylmalonate.

Furthermore, 2-vinyloxyethyl phthalimide represented by the following formula X-3 was obtained from chloroethyl vinyl ether and potassium phthalimide, while 2-benzoyloxyethyl vinyl ether, which is represented by the following formula X-4, was obtained from chloroethyl vinyl ether and sodium benzoate.

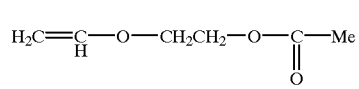

X-1

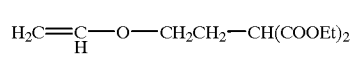

X-2

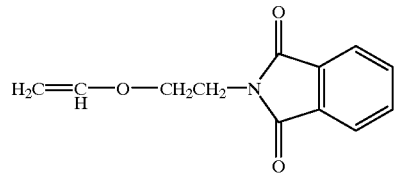

X-3

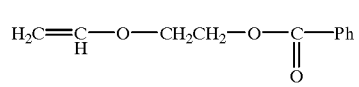

X-4

Synthesis Example II-1

In 120 ml of butyl acetate was dissolved 32.4 g (0.2 mol) of p-acetoxystyrene. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 150 ml of methanol. Thereto was added an aqueous solution prepared by dissolving 7.7 g (0.19 mol) of sodium hydroxide in 50 ml of water. This mixture was heated with refluxing for 3 hours to hydrolyze the resin. Thereafter, the reaction mixture was diluted with 200 ml of water and neutralized with hydrochloric acid to precipitate a white resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain poly(p-hydroxystyrene) as alkali-soluble resin A-1.

The resin obtained had a weight-average molecular weight of 15,000.

Synthesis Example II-2

In 100 ml of tetrahydrofuran were dissolved 35.25 g (0.2 mol) of p-tert-butoxystyrene and 5.21 g (0.05 mol) of styrene which both had been purified by dehydration and distillation in an ordinary way. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 150 ml of tetrahydrofuran.

Thereto was added 4 N hydrochloric acid. This mixture was heated with refluxing for 6 hours to hydrolyze the resin. Thereafter, the reaction mixture was poured into 5 L of ultrapure water to reprecipitate a resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/styrene copolymer as alkali-soluble resin A-2.

The resin obtained had a weight-average molecular weight of 12,000.

Synthesis Example II-3

In 120 ml of butyl acetate were dissolved 32.4 g (0.2 mol) of p-acetoxystyrene and 7.01 g (0.07 mol) of methyl methacrylate. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 200 ml of methanol.

Thereto was added an aqueous solution prepared by dissolving 7.7 g (0.19 mol) of sodium hydroxide in 50 ml of water. This mixture was heated with refluxing for 1 hour to hydrolyze the resin. Thereafter, the reaction mixture was diluted with 200 ml of water and neutralized with hydrochloric acid to precipitate a white resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/methyl methacrylate copolymer as alkali-soluble resin A-3. The resin obtained had a weight-average molecular weight of 10,000.

Synthesis Example II-4

Poly(p-hydroxystyrene) (VP 8000) manufactured by Nippon Soda Co., Ltd., Japan was used as alkali-soluble resin A-4. This resin had a weight-average molecular weight of 9,800.

In 200 ml of tetrahydrofuran was dissolved 50 g of the resin A-4. Thereto was added 3.27 g (0.042 mol) of acetyl chloride. To this mixture was added dropwise, with stirring, 4.21 g (0.042 mol) of triethylamine. Thereafter, the resultant mixture was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/p-acetoxystyrene copolymer as alkali-soluble resin A-5. The resin obtained had a weight-average molecular weight of 10,000.

Synthesis Example III-1

The following ingredients were mixed together in a flask.

| | |
|---|---|
| Alkali-soluble resin A-4, obtained in Synthesis Example II-4 | 20 g |
| Tetrahydrofuran | 80 ml |
| Vinyl ether X-1, obtained in Synthesis Example I-1 | 7.58 g |

Thereto was added 10 mg of p-toluenesulfonic acid, and this mixture was stirred at room temperature for 18 hours.

The resultant reaction mixture was added dropwise to 5 L of ultrapure water with vigorous agitation to conduct reprecipitation.

The resin thus obtained was dried in a vacuum dryer at 70° C. for 12 hours to obtain alkali-soluble resin B-1 having substituents according to the present invention.

Synthesis Examples III-2 to III-10

Using the alkali-soluble resins and vinyl ethers shown in Table 1 alkali-soluble resins B-2 to B-10 having substituents according to the present invention were obtained in the same manner as in Synthesis Example III-1.

Synthesis Examples IV-1 to IV-4

Alkali-soluble resins C-1 to C-4 having substituents which are not a group represented by the general formula (I) according to the present invention were obtained from the alkali-soluble resins shown in Table 1 and from ethyl vinyl ether (Y-1), isobutyl vinyl ether (Y-2), or chloroethyl vinyl ether (Y-3).

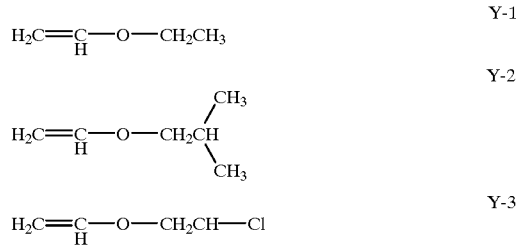

TABLE 1

Results of Resin Syntheses

| Synthesis Example | Resin No. | Alkali-soluble resin Kind | Amount (g) | Vinyl ether Kind | Amount (g) | Molecular weight | Molecular weight distribution |
|---|---|---|---|---|---|---|---|
| III-1 | B-1 | A-4 | 20 | X-1 | 7.58 | 10300 | 1.07 |
| III-2 | B-2 | A-4 | 20 | X-2 | 13.42 | 10200 | 1.07 |
| III-3 | B-3 | A-4 | 20 | X-3 | 12.66 | 10500 | 1.08 |
| III-4 | B-4 | A-4 | 20 | X-4 | 11.20 | 10400 | 1.08 |
| III-5 | B-5 | A-1 | 20 | X-1 | 6.50 | 15500 | 3.00 |
| III-6 | B-6 | A-2 | 20 | X-1 | 5.20 | 12700 | 2.50 |
| III-7 | B-7 | A-3 | 20 | X-1 | 4.55 | 10500 | 2.00 |
| III-8 | B-8 | A-5 | 20 | X-1 | 5.85 | 11000 | 1.09 |
| III-9 | B-9 | A-2 | 20 | X-2 | 9.20 | 12900 | 2.60 |
| III-10 | B-10 | A-5 | 20 | X-4 | 11.52 | 10600 | 1.08 |
| IV-1 | C-1 | A-4 | 20 | Y-1 | 4.20 | 10500 | 1.07 |
| IV-2 | C-2 | A-4 | 20 | Y-2 | 5.84 | 10600 | 1.07 |
| IV-3 | C-3 | A-2 | 20 | Y-1 | 2.88 | 12500 | 2.60 |
| IV-4 | C-4 | A-5 | 20 | Y-3 | 4.50 | 10500 | 1.07 |

TABLE 2

Examples and Comparative Examples

| | No. | Resin | Photo-acid generator | Organic basic compound |
|---|---|---|---|---|
| Example | 1 | B-1 (1.60 g) | D-1 (0.080 g) | E-3 (0.005 g) |
| | 2 | B-2 (1.55 g) | D-1 (0.080 g) | E-3 (0.004 g) |
| | 3 | B-3 (1.55 g) | D-1 (0.080 g) | E-3 (0.004 g) |
| | 4 | B-4 (1.60 g) | D-1 (0.080 g) | E-3 (0.005 g) |
| | 5 | B-5 (1.55 g) | D-1 (0.080 g) | — |
| | 6 | B-6 (1.55 g) | D-1 (0.080 g) | E-1 (0.003 g) |
| | 7 | B-7 (1.60 g) | D-2 (0.080 g) | — |
| | 8 | B-8 (1.55 g) | D-2 (0.080 g) | E-2 (0.003 g) |
| | 9 | B-9 (1.55 g) | D-3 (0.080 g) | — |
| | 10 | B-10 (1.60 g) | D-3 (0.080 g) | E-3 (0.004 g) |
| | 11 | B-1 (1.55 g) | D-2 (0.080 g) | E-2 (0.003 g) |
| | 12 | B-1 (1.60 g) | D-2 (0.080 g) | — |
| Comparative Example | 1 | C-1 (1.55 g) | D-1 (0.080 g) | E-3 (0.005 g) |
| | 2 | C-2 (1.55 g) | D-1 (0.080 g) | E-3 (0.005 g) |
| | 3 | C-3 (1.60 g) | D-2 (0.080 g) | — |
| | 4 | C-4 (1.55 g) | D-2 (0.080 g) | E-2 (0.003 g) |

Examples 1 to 12 and Comparative Examples 1 to 4

Preparation and Evaluation of Photosensitive Compositions

Each ingredient combination shown in Table 2 was dissolved in 8 g of PGMEA (propylene glycol monoethyl ether acetate). The resultant solution was filtered through a 0.2 $\mu$m filter to prepare a resist solution. Each resist solution thus obtained was applied to a silicon wafer with a spin coater, and the coating was dried at 130° C. for 60 seconds with a vacuum holding type hot plate to obtain a resist film having a thickness of 0.8 $\mu$m.

The photo-acid generators and organic basic compounds used in the Examples are shown below.

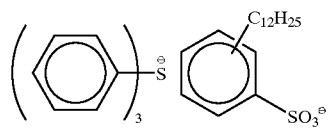
(D-1)

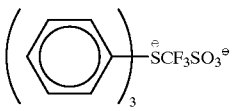
(D-2)

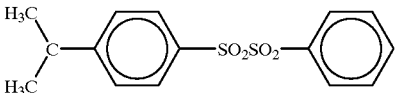
(D-3)

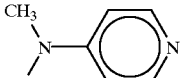
(E-1)

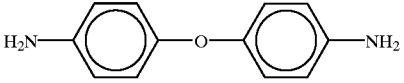
(E-2)

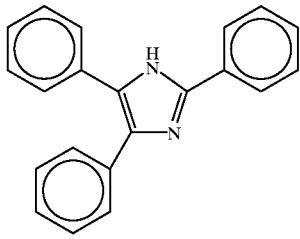
(E-3)

These resist films were exposed to light using a 248 nm KrF excimer laser stepper (NA=0.45). After the exposure, the resist films each was heated with a 100° C. hot plate for 60 seconds, immediately thereafter immersed in 0.26 N aqueous tetramethylammonium hydroxide (TMAH) solution for 60 seconds, rinsed with water for 30 seconds, and then dried. The thus-obtained resist patterns on silicon wafers were examined with a scanning electron microscope to evaluate resist performance. The results obtained are shown in Table 3.

Resolution is expressed in terms of threshold resolution at the exposure amount necessary for reproducing a 0.40 $\mu$m mask pattern.

Pattern surface depressions were evaluated from results of an examination of tops of a 0.30 $\mu$m L/S mask pattern with a scanning electron microscope. The mask patterns having no depressions are indicated by "A", those having slight depressions are indicated by "B", and that having considerable depressions is indicated by "C".

Adhesion to substrate was judged based on the occurrence or nonoccurrence of pattern collapse after development. The resist patterns which had undergone no pattern collapse are indicated by "A", those which had undergone slight pattern collapse are indicated by "B", and that which had undergone considerable pattern collapse is indicated by "C".

TABLE 3

Results of Resist Evaluation

| | No. | Threshold Resolution ($\mu$m) | Pattern Top Depression | Adhesion to Substrate |
|---|---|---|---|---|
| Example | 1 | 0.25 | A | A |
| | 2 | 0.25 | A | A |

TABLE 3-continued

Results of Resist Evaluation

|  | No. | Threshold Resolution (μm) | Pattern Top Depression | Adhesion to Substrate |
|---|---|---|---|---|
|  | 3 | 0.26 | A | A |
|  | 4 | 0.26 | A | A |
|  | 5 | 0.25 | A | A |
|  | 6 | 0.26 | A | A |
|  | 7 | 0.25 | A | A |
|  | 8 | 0.26 | A | A |
|  | 9 | 0.26 | A | A |
|  | 10 | 0.25 | A | A |
|  | 11 | 0.26 | A | A |
|  | 12 | 0.26 | A | A |
| Comparative Example | 1 | 0.27 | B | B |
|  | 2 | 0.27 | B | C |
|  | 3 | 0.27 | C | B |
|  | 4 | 0.27 | B | B |

The results given in Table 3 show that the positive photoresist compositions obtained in the Examples according to the present invention each gave satisfactory results, whereas the photoresist compositions obtained in the Comparative Examples were unsatisfactory in threshold resolution, pattern top depressions, and adhesion to substrate.

The present invention has an effect of providing an excellent, chemically amplified positive photoresist composition which has high resolution and gives a resist pattern having no depressions in a top part thereof and having satisfactory adhesion to the substrate.

While the invention has been described in detail and with reference to specific embodiments thereof, it will be apparent to one skilled in the art that various changes and modifications can be made therein without departing from the spirit and scope thereof.

What is claimed is:

1. A positive photoresist composition which comprises (a) a resin obtained from an alkali-soluble resin containing phenolic hydroxyl groups by replacing from 10 to 80% of the phenolic hydroxyl groups with a group represented by the following general formula (I), (b) a compound which generates an acid upon irradiation with actinic rays or a radiation, and (c) a solvent,

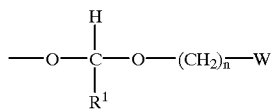
(I)

wherein
  $R^1$ represents a substituent selected from alkyl groups having 1 to 4 carbon atoms;
  W is a group selected from the group consisting of the following substituents:

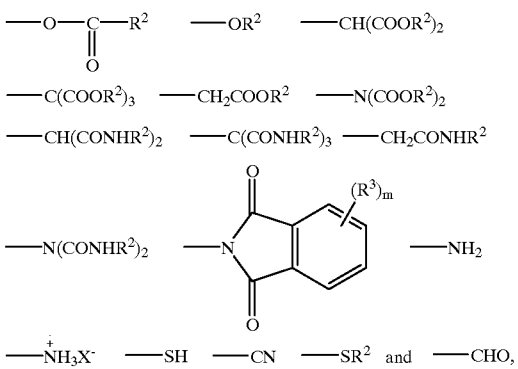

wherein
  $R^2$ represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group, provided that when W is

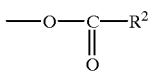

or $—OR^2$, then
  $R^2$ represents a linear, branched or cyclic alkenyl group having 2 to 6 carbon atoms;
  $R^3$ represents a hydrogen atom, a linear, branched, or cyclic alkyl group having 1 to 6 carbon atoms, a linear, branched, or cyclic alkoxy group having 1 to 6 carbon atoms, or a substituent selected from the group consisting of a halogen atom, a nitro group, an amino group, a hydroxyl group, and a cyano group;
  X represents a halogen atom; and
  m represents a natural number of from 1 to 4; and
  n represents a natural number of from 1 to 4.

2. The positive photoresist composition of claim 1, wherein the alkali-soluble resin containing phenolic hydroxyl groups is poly(p-hydroxystyrene).

3. The positive photoresist composition of claim 1, wherein component (a) is a resin obtained by replacing from 15 to 60% of the phenolic hydroxyl groups of the alkali-soluble resin with a group represented by the general formula (I).

4. The positive photoresist composition of claim 1, wherein component (a) is a resin obtained by replacing from 20 to 40% of the phenolic hydroxyl groups of the alkali-soluble resin with a group represented by the general formula (I).

* * * * *